(12) United States Patent
Shin et al.

(10) Patent No.: US 12,745,516 B2
(45) Date of Patent: Sep. 22, 2026

(54) DISPLAY DEVICE AND METHOD FOR MANUFACTURING THE SAME

(71) Applicant: Samsung Display Co., LTD., Yongin-si (KR)

(72) Inventors: Hyuneok Shin, Yongin-si (KR); Joonyong Park, Yongin-si (KR); Dongmin Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 354 days.

(21) Appl. No.: 18/525,045

(22) Filed: Nov. 30, 2023

(65) Prior Publication Data

US 2024/0324306 A1 Sep. 26, 2024

(51) Int. Cl.
*H10K 59/12* (2023.01)
*H10K 59/122* (2023.01)
*H10K 59/88* (2023.01)

(52) U.S. Cl.
CPC ....... *H10K 59/122* (2023.02); *H10K 59/1201* (2023.02); *H10K 59/88* (2023.02)

(58) Field of Classification Search
CPC ............. H10K 59/1201; H10K 59/122; H10K 59/8731; H10K 59/88
See application file for complete search history.

(56) References Cited

U.S. PATENT DOCUMENTS 9,337,244 B2 5/2016 Hatano et al.
11,348,983 B1 5/2022 Choung et al.
2022/0077251 A1 3/2022 Choung et al.
2024/0172523 A1* 5/2024 Shin ..................... H10K 59/122
2024/0196697 A1* 6/2024 Kim .................. H10K 59/1201
2024/0276806 A1* 8/2024 Lee ...................... H10K 59/122

FOREIGN PATENT DOCUMENTS

CN 111584761 A 8/2020
CN 113471384 A 10/2021
JP 2008135325 A 6/2008
KR 20090002717 A 1/2009

* cited by examiner

*Primary Examiner* — Jaehwan Oh
(74) *Attorney, Agent, or Firm* — CANTOR COLBURN LLP

(57) ABSTRACT

A display device includes a base layer, a first electrode disposed on the base layer, a pixel defining layer that is disposed on the base layer and that defines a light-emitting opening that exposes at least a portion of the first electrode, a barrier wall that is disposed on the pixel defining layer and that defines a barrier wall opening corresponding to the light-emitting opening, an emission pattern disposed on the first electrode in the barrier wall opening, a second electrode disposed on the emission pattern in the barrier wall opening, and a dummy part that is disposed on the barrier wall and that includes a same material as that of the emission pattern and the second electrode. An upper surface of the dummy part has an inclined surface.

20 Claims, 18 Drawing Sheets

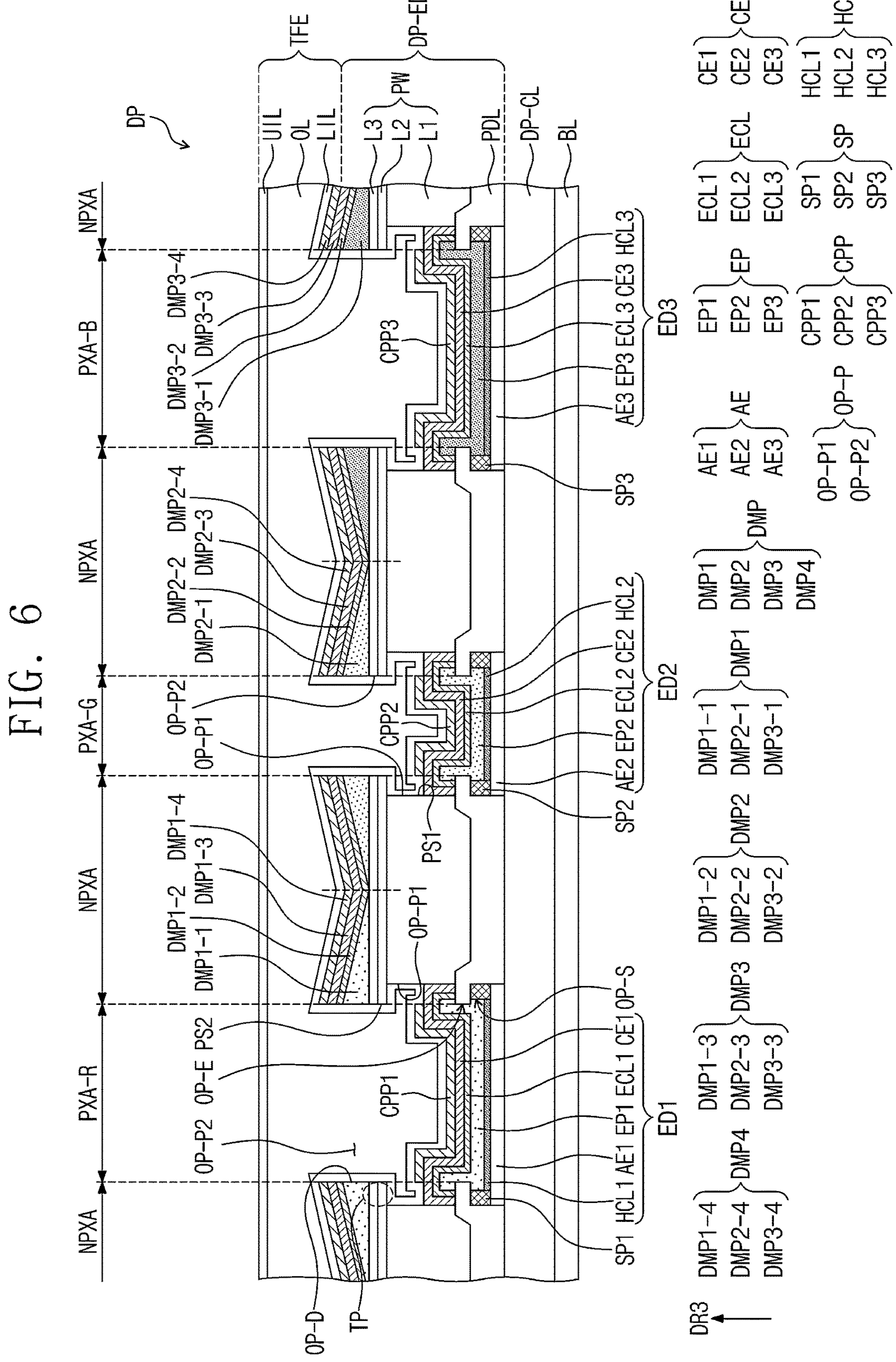
FIG. 6
DP
TFE
DP-ED
UIL
OL
LIL
L3
L2
L1
PW
PDL
DP-CL
BL
NPXA
PXA-B
NPXA
PXA-G
NPXA
PXA-R
NPXA
DMP3-4
DMP3-3
DMP3-2
DMP3-1
CPP3
DMP2-4
DMP2-3
DMP2-2
DMP2-1
OP-P2
OP-P1
CPP2
PS1
DMP1-4
DMP1-3
DMP1-2
DMP1-1
OP-P1
OP-S
PS2
OP-E
OP-P2
CPP1
OP-D
TP
AE3 EP3 ECL3 CE3 HCL3
ED3
SP3
AE2 EP2 ECL2 CE2 HCL2
ED2
SP2
SP1 HCL1 AE1 EP1 ECL1 CE1
ED1
CE1 CE2 CE3 CE
HCL1 HCL2 HCL3 HCL
ECL1 ECL2 ECL3 ECL
SP1 SP2 SP3 SP
EP1 EP2 EP3 EP
CPP1 CPP2 CPP3 CPP
AE1 AE2 AE3 AE
OP-P1 OP-P2 OP-P
DMP1 DMP2 DMP3 DMP4 DMP
DMP1-1 DMP2-1 DMP3-1 DMP1
DMP1-2 DMP2-2 DMP3-2 DMP2
DMP1-3 DMP2-3 DMP3-3 DMP3
DMP1-4 DMP2-4 DMP3-4 DMP4
DR3

DMP1-3 DMP1-4
DMP1-2 DMP1-1
OP-E PS2
DMP2-3 DMP2-4
DMP2-2 DMP2-1
DMP3-3 DMP3-4
DMP3-2 DMP3-1
OP-D
UIL
OL
LIL
TFE
TP
PS1
OP-P2
OP-P1
OP-P
L3
L2
L1
PW
DP-CL
BL
SP1 HCL1 AE1 EP1 ECL1 CE1 OP-S
ED1
SP2 AE2 EP2 ECL2 CE2 HCL2
ED2
SP3
AE3 EP3 ECL3 CE3 HCL3
ED3
DR3
DMP1-4 DMP2-4 DMP3-4 DMP4-4 DMP4
DMP1-3 DMP2-3 DMP3-3 DMP4-3 DMP3
DMP1-2 DMP2-2 DMP3-2 DMP4-2 DMP2
DMP1-1 DMP2-1 DMP3-1 DMP4-1 DMP1
AE1 AE2 AE3 AE
EP1 EP2 EP3 EP
ECL1 ECL2 ECL3 ECL
CE1 CE2 CE3 CE
DMP1 DMP2 DMP3 DMP4 DMP
CPP1 CPP2 CPP3 CPP
SP1 SP2 SP3 SP
HCL1 HCL2 HCL3 HCL

DISPLAY DEVICE AND METHOD FOR MANUFACTURING THE SAME

This application claims priority to Korean Patent Application No. 10-2023-0038089, filed on Mar. 23, 2023, and all the benefits accruing therefrom under 35 U.S.C. § 119, the content of which in its entirety is herein incorporated by reference.

BACKGROUND

1. Field

Embodiments of the disclosure described herein relate to a display device and a manufacturing method thereof.

2. Description of the Related Art

A display device is activated depending on an electrical signal. The display device may include a display panel that displays an image. In the display panel, an organic light-emitting display panel has low power consumption, high luminance, and high response speed.

The organic light-emitting display panel includes first electrodes, second electrodes, and emission patterns. The emission patterns for respective emissive regions are separated from each other, and the second electrodes provide a common voltage to the emissive regions.

SUMMARY

Embodiments of the disclosure provide a display device and a manufacturing method thereof, in which a process is simplified by forming first to third emission patterns using a metal mask and simultaneously forming electron control layers, second electrodes, capping patterns, and a thin film encapsulation layer on the first to third emission patterns without using the metal mask.

In an embodiment of the disclosure, a display device includes a base layer, a first electrode disposed on the base layer, a pixel defining layer that is disposed on the base layer and that defines a light-emitting opening that exposes at least a portion of the first electrode, a barrier wall that is disposed on the pixel defining layer and that defines a barrier wall opening corresponding to the light-emitting opening, an emission pattern disposed on the first electrode in the barrier wall opening, a second electrode disposed on the emission pattern in the barrier wall opening, and a dummy part that is disposed on the barrier wall and that includes a same material as that of the emission pattern and the second electrode. An upper surface of the dummy part has an inclined surface.

In an embodiment of the disclosure, a method for manufacturing a display device includes providing a first electrode on a base layer, providing a pixel defining layer on the base layer to cover the first electrode, providing a barrier wall on the pixel defining layer, defining a light-emitting opening and a barrier wall opening to expose at least a portion of the first electrode, providing, on the barrier wall, a metal mask in which a mask opening that overlaps the light-emitting opening and the barrier wall opening is defined, providing an emission pattern and a second electrode on the first electrode in the light-emitting opening and the barrier wall opening, and providing, on the barrier wall, a dummy part including a same material as that of the emission pattern and the second electrode. The dummy part is simultaneously formed together with the emission pattern and the second electrode.

BRIEF DESCRIPTION OF THE DRAWINGS

The above and other embodiments, advantages and features of the disclosure will become apparent by describing in detail embodiments thereof with reference to the accompanying drawings.

FIG. 6 is a cross-sectional view taken along line I-I' illustrated in FIG. 5.

DETAILED DESCRIPTION

Figure 1:
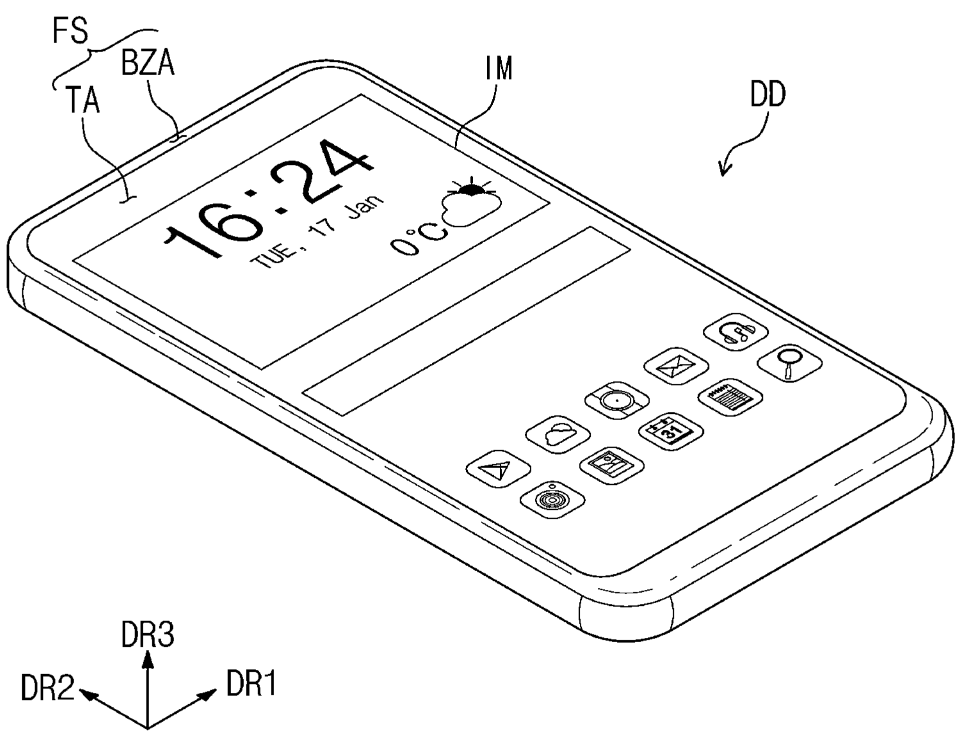
FIG. 1 is a perspective view of an embodiment of a display device according to the disclosure.

The above and other features and advantages of the disclosure will become apparent from the following description of embodiments given in conjunction with the accompanying drawings. However, the disclosure is not limited to the embodiments disclosed herein and may be implemented in various different forms. Herein, the embodiments are provided to provide complete disclosure of the disclosure and to provide thorough understanding of the disclosure to those skilled in the art to which the disclosure pertains, and the scope of the disclosure should be limited only by the accompanying claims and equivalents thereof. Like reference numerals refer to like elements throughout.

When one element or layer is referred to as being "on" another element or layer, it can be directly on the other element or layer, or intervening elements or layers may be present. In contrast, when one element is referred to as being "directly on" another element or layer, there are no intervening elements or layers present. As used herein, the term "and/or" includes each of mentioned items and all combinations of one or more of the items.

Spatially relative terms, such as "below", "beneath", "lower", "above", "upper" and the like, may be used to easily describe a correlation between one element or component and another element or component as illustrated in the drawings. The spatially relative terms should be understood as terms including different directions of an element during use or operation in addition to the direction illustrated in the drawings. Like reference numerals refer to like elements throughout.

Although the terms "first," "second," and the like are used herein to describe various elements, components, and/or sections, these elements, components, and/or sections should not be limited by these terms. These terms are only used to distinguish one element, component, or section from another element, component, or section. Accordingly, a first element, a first component, or a first section mentioned below could be termed a second element, a second component, or a second section within the spirit and scope of the disclosure.

Embodiments described herein will be described with reference to plan views and cross-sectional views which are ideal schematic views of the disclosure. Accordingly, the forms of illustrative drawings may be changed according to manufacturing technology and/or allowable errors. Embodiments of the disclosure are not limited to specific forms illustrated, but include changes in the forms generated according to manufacturing processes. Regions illustrated in the drawings have schematic properties, and the shapes of the regions illustrated in the drawings illustrate specific forms of regions of devices and are not intended to limit the scope of the disclosure.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within +30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments of the disclosure will be described in more detail with reference to the accompanying drawings.

Figure 2:
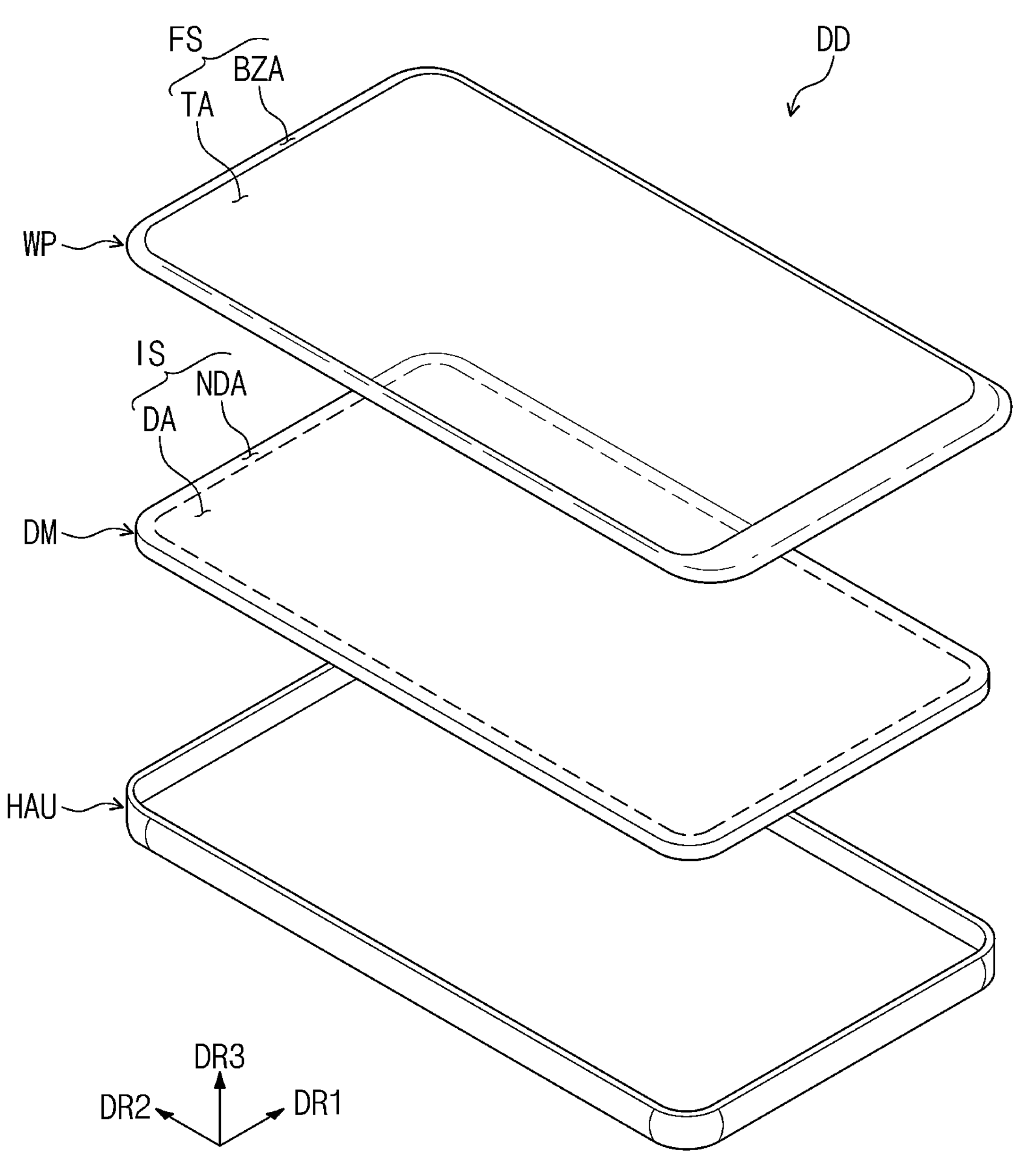
FIG. 2 is an exploded perspective view of an embodiment of the display device according to the disclosure.
Figure 3:
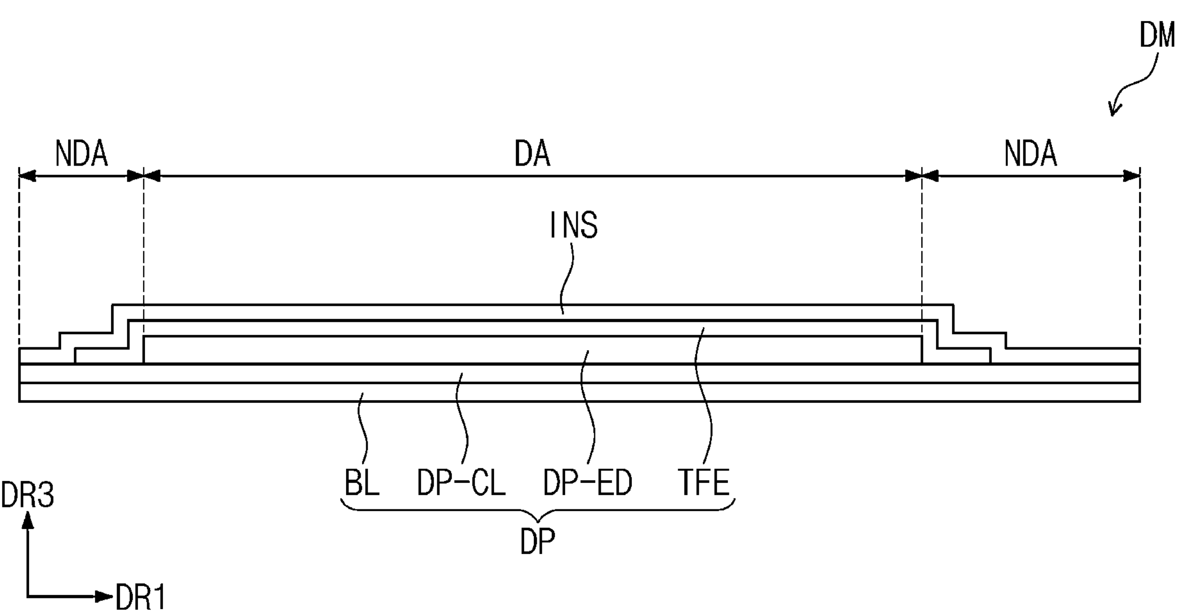
FIG. 3 is a cross-sectional view of an embodiment of a display module according to the disclosure.

FIG. 1 is a perspective view of an embodiment of a display device according to the disclosure. FIG. 2 is an exploded perspective view of an embodiment of the display device according to the disclosure. FIG. 3 is a cross-sectional view of an embodiment of a display module according to the disclosure.

Referring to FIG. 1, the display device DD in an embodiment of the disclosure may have a quadrangular shape, e.g., rectangular shape with short sides extending in a first direction DR1 and long sides extending in a second direction DR2 crossing the first direction DR1. However, without being limited thereto, the display device DD may have various shapes such as a circular shape, a polygonal shape, or the like. The display device DD may be a flexible display device.

Hereinafter, a direction substantially vertically crossing a plane defined by the first direction DR1 and the second direction DR2 is defined as a third direction DR3. In addition, the expression "in a plan view" used herein may mean that it is viewed in third direction DR3.

An upper surface of the display device DD may be defined as a display surface FS. The display surface FS may have a plane defined by the first direction DR1 and the second direction DR2. Images IM generated by the display device DD may be provided to a user through the display surface FS.

Referring to FIGS. 1 and 2, the display device DD may include a window WP, the display module DM, and a housing HAU. The window WP and the housing HAU may be coupled with each other to form an exterior of the display device DD.

The window WP may include an optically clear insulating material. In an embodiment, the window WP may include glass or plastic. A front surface of the window WP may define the display surface FS of the display device DD, for example. The display surface FS may include a transmissive region TA and a bezel region BZA. The transmissive region TA may be an optically transparent region. In an embodiment, the transmissive region TA may be a region having a visible light transmittance of about 90% or more, for example.

The bezel region BZA may define the shape of the transmissive region TA. The bezel region BZA may be adjacent to the transmissive region TA and may surround the transmissive region TA. This is illustrative, and in the window WP according to the disclosure, the bezel region BZA may be omitted. The window WP may include at least one of an anti-fingerprint layer, a hard coating layer, and an anti-reflective layer and is not limited to any particular embodiment.

The display module DM may be disposed under the window WP. The display module DM may be a component that substantially generates the images IM. The images IM generated by the display module DM may be displayed on a display surface IS of the display module DM and may be visually recognized by the user from the outside through the transmissive region TA.

The display module DM may include a display region DA and a non-display region NDA. The display region DA may be a region activated depending on an electrical signal. The non-display region NDA may be adjacent to the display region DA. The non-display region NDA may surround the display region DA. The non-display region NDA may be a region covered by the bezel region BZA and may not be visible from the outside.

As illustrated in FIG. 2, the housing HAU may be coupled with the window WP. The housing HAU may be coupled with the window WP to provide a predetermined inner space. The display module DM may be accommodated in the inner space.

The housing HAU may include a material having a relatively high rigidity. In an embodiment, the housing HAU may include glass, plastic, or metal, or may include a plurality of frames and/or plates including or consisting of a combination of the aforementioned materials, for example. The housing HAU may stably protect components of the display device DD accommodated in the inner space from an external impact.

Referring to FIG. 3, the display module DM may include a display panel DP and an input sensor INS. Although not illustrated, the display device DD in an embodiment of the disclosure may further include a protective member disposed on a lower surface of the display panel DP or an anti-reflective member and/or a window member disposed on an upper surface of the input sensor INS.

The display panel DP may be an emissive display panel and is not particularly limited.

In an embodiment, the display panel DP may be an organic light-emitting display panel or an inorganic light-emitting display panel, for example. An emissive layer in the organic light-emitting display panel includes an organic light-emitting material. An emissive layer in the inorganic light-emitting display panel includes a quantum dot, a quantum rod, or a micro LED. Hereinafter, the display panel DP will be described as an organic light-emitting display panel.

The display panel DP may include a base layer BL, and a circuit element layer DP-CL, a display element layer DP-ED, and a thin film encapsulation layer TFE that are disposed on the base layer BL. The input sensor INS may be directly disposed on the thin film encapsulation layer TFE. As used herein, the expression "component A is directly disposed on component B" means that an adhesive layer is not disposed between component A and component B.

The base layer BL may include at least one plastic film. The base layer BL may be a flexible substrate and may include a plastic substrate, a glass substrate, a metal substrate, or an organic/inorganic composite substrate. In this specification, the display region DA and the non-display region NDA may be defined in the base layer BL, and components disposed on the base layer BL may be disposed to overlap the display region DA or the non-display region NDA.

The circuit element layer DP-CL includes at least one insulating layer and a circuit element. The insulating layer includes at least one inorganic layer and at least one organic layer. The circuit element includes signal lines and a pixel drive circuit.

The display element layer DP-ED includes a barrier wall and a light-emitting element. The light-emitting element may include a first electrode, a hole control layer, an emission pattern, an electron control layer, and a second electrode. The barrier wall and the light-emitting element will be described in detail with reference to FIGS. 6 and 7.

The thin film encapsulation layer TFE includes a plurality of thin films. Some of the thin films are disposed to improve optical efficiency, and the other thin films are disposed to protect organic light-emitting diodes.

The input sensor INS obtains coordinate information of an external input. The input sensor INS may have a multi-layer structure. The input sensor INS may include a single conductive layer or multiple conductive layers. The input sensor INS may include a single insulating layer or multiple insulating layers. In an embodiment, the input sensor INS may sense an external input in a capacitive type, for example. In the disclosure, an operating method of the input sensor INS is not particularly limited, and in an embodiment of the disclosure, the input sensor INS may sense an external input using an electromagnetic induction method or a pressure sensing method. In an embodiment of the disclosure, the input sensor INS may be omitted.

Figure 4:
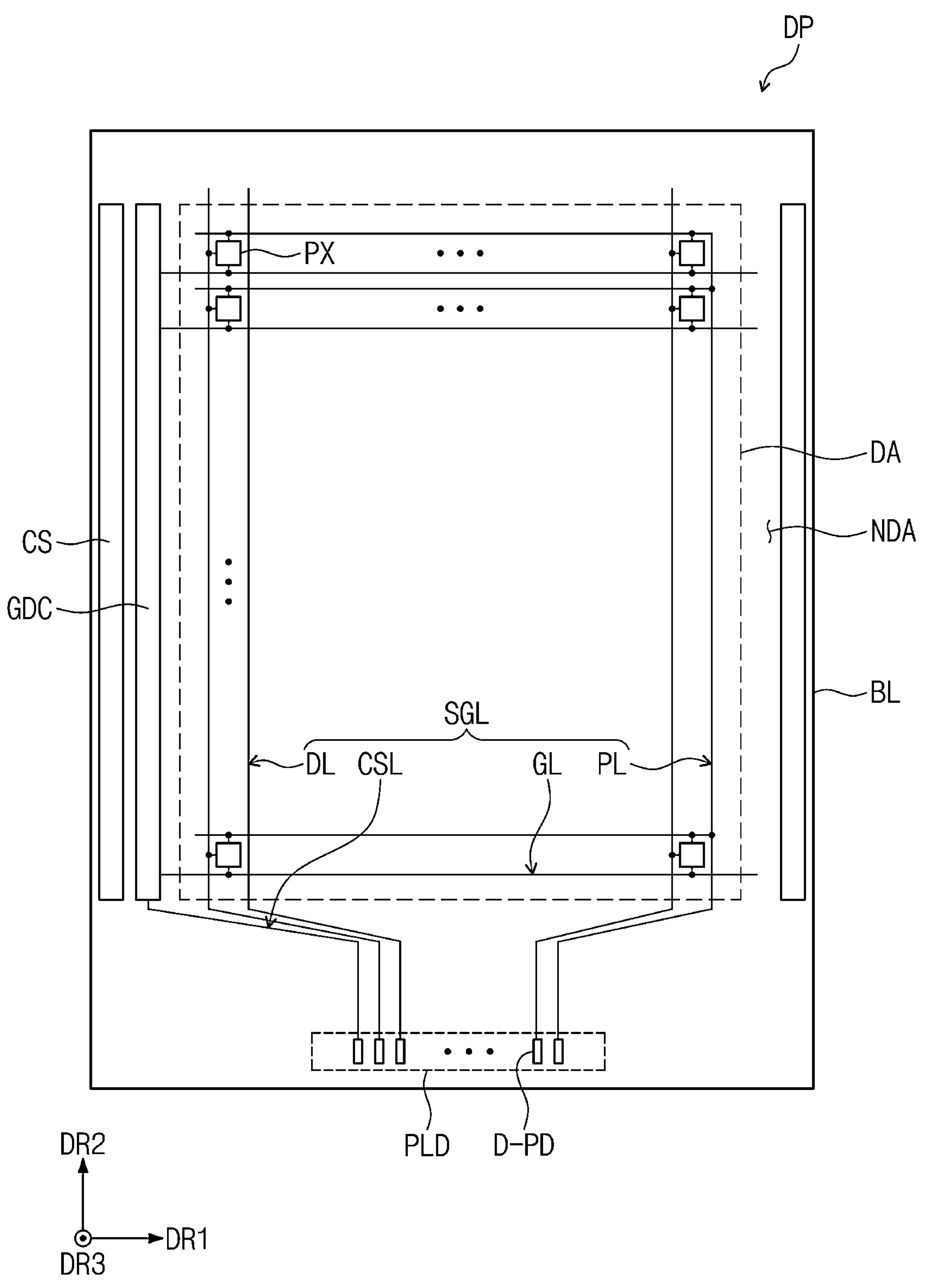
FIG. 4 is a plan view of an embodiment of a display panel illustrated in FIG. 3 according to the disclosure.

FIG. 4 is a plan view of an embodiment of the display panel illustrated in FIG. 3 according to the disclosure.

Referring to FIG. 4, the display panel DP may include the base layer BL divided into the display region DA and the non-display region NDA described with reference to FIG. 3.

The display panel DP may include pixels PX disposed in the display region DA and signal lines SGL electrically connected to the pixels PX. The display panel DP may include a drive circuit GDC, a pad part PLD, and spacers CS that are disposed in the non-display region NDA.

The pixels PX may be arranged in the first direction DR1 and the second direction DR2. The pixels PX may include a plurality of pixel rows that extend in the first direction DR1 and that are arranged in the second direction DR2 and a plurality of pixel columns that extend in the second direction DR2 and that are arranged in the first direction DR1.

The signal lines SGL may include gate lines GL, data lines DL, a power line PL, and a control signal line CSL. Each of the gate lines GL may be connected to a corresponding one of the pixels PX, and each of the data lines DL may be connected to a corresponding one of the pixels PX. The power line PL may be electrically connected to the pixels PX. The control signal line CSL may be connected to the drive circuit GDC and may provide control signals to the drive circuit GDC.

The drive circuit GDC may include a gate drive circuit. The gate drive circuit may generate gate signals and may sequentially output the generated gate signals to the gate lines GL. The gate drive circuit may additionally output other control signals to the pixel drive circuit.

The pad part PLD may be a part to which a flexible circuit board is connected. The pad part PLD may include pixel pads D-PD, and the pixel pads D-PD may be pads for connecting the flexible circuit board to the display panel DP. Each of the pixel pads D-PD may be connected with a corresponding one of the signal lines SGL. The pixel pads D-PD may be connected to the corresponding pixels PX through the signal lines SGL. Furthermore, one pixel pad among the pixel pads D-PD may be connected to the drive circuit GDC.

In addition, the pad part PLD may further include input pads. The input pads may be pads for connecting a flexible circuit board to the input sensor INS (refer to FIG. 3). However, without being limited thereto, the input pads may be disposed on the input sensor INS (refer to FIG. 3) and may be connected with the pixel pads D-PD and a separate circuit board. In an alternative embodiment, the input sensor INS (refer to FIG. 3) may be omitted, and the input pads may not be additionally included.

The spacers CS may be disposed in the non-display region NDA. The spacers CS may be spaced apart from each other in the first direction DR1. Each of the spacers CS may extend in the second direction DR2. The spacer CS disposed on the left side among the spacers CS may be closer to the periphery of the display panel DP than the drive circuit GDC is to the periphery of the display panel DP.

The spacers CS may prevent contact between a metal mask MMK to be described below with reference to FIG. 8H and the display panel DP. This operation will be described in detail with reference to FIG. 8G.

Figure 5:
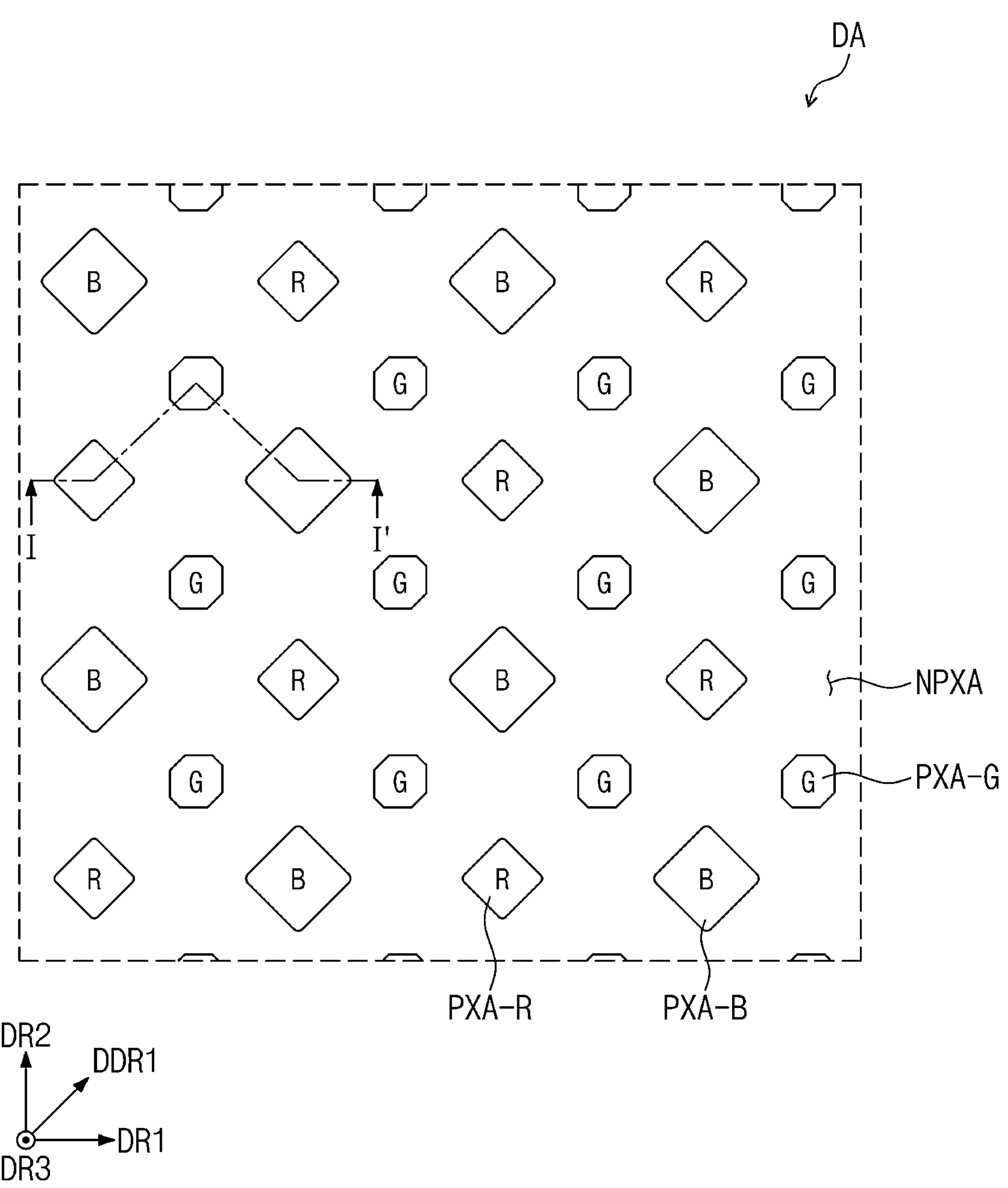
FIG. 5 is an enlarged plan view of an embodiment of a portion of a display region of the display panel according to the disclosure.

FIG. 5 is an enlarged plan view of an embodiment of a portion of the display region of the display panel according to the disclosure.

Referring to FIG. 5, the display region DA may include first to third emissive regions PXA-R, PXA-G, and PXA-B and a peripheral region NPXA surrounding the first to third emissive regions PXA-R, PXA-G, and PXA-B. The first to third emissive regions PXA-R, PXA-G, and PXA-B may correspond to regions through which light beams provided from light-emitting elements ED1, ED2, and ED3, which will be described below with reference to FIG. 6, are emitted. The first to third emissive regions PXA-R, PXA-G, and PXA-B may be distinguished from one another depending on the colors of light beams emitted toward the outside of the display module DM (refer to FIG. 3).

The first to third emissive regions PXA-R, PXA-G, and PXA-B may provide first to third color light beams having different colors. In an embodiment, the first color light beam may be red light, the second color light beam may be green light, and the third color light beam may be blue light, for example. However, the first to third color light beams are not necessarily limited thereto.

The first to third emissive regions PXA-R, PXA-G, and PXA-B may be defined as regions where upper surfaces of first electrodes AE (refer to FIG. 6) are exposed by light-emitting openings OP-E (refer to FIG. 6) that will be described below. The peripheral region NPXA may set the boundaries of the first to third emissive regions PXA-R, PXA-G, and PXA-B and may prevent color mixing between the first to third emissive regions PXA-R, PXA-G, and PXA-B.

A plurality of first emissive regions PXA-R, a plurality of second emissive regions PXA-G, and a plurality of third emissive regions PXA-B may be provided. The plurality of first emissive regions PXA-R, the plurality of second emissive regions PXA-G, and the plurality of third emissive regions PXA-B may have a predetermined arrangement in the display region DA and may be repeatedly disposed. In an embodiment, the first and third emissive regions PXA-R and PXA-B may be alternately arranged in the first direction DR1 to form a "first group", for example. The second emissive regions PXA-G may be arranged in the first direction DR1 to form a "second group". The "first group" and the "second group" may be provided in plural numbers, and the "first groups" and the "second groups" may be alternately arranged in the second direction DR2.

One second emissive region PXA-G may be spaced apart from one first emissive region PXA-R or one third emissive region PXA-B in a first diagonal direction DDR1. The first diagonal direction DDR1 may be defined as a direction crossing the first direction DR1 and the second direction DR2.

FIG. 5 illustrates the arrangement of the first to third emissive regions PXA-R, PXA-G, and PXA-B. However, without being limited thereto, the first to third emissive regions PXA-R, PXA-G, and PXA-B may be arranged in various forms. In an embodiment, the first to third emissive regions PXA-R, PXA-G, and PXA-B may have a PENTILE™ arrangement form as illustrated in FIG. 5. In an alternative embodiment, the first to third emissive regions PXA-R, PXA-G, and PXA-B may have a stripe arrangement form or a diamond arrangement form.

The first to third emissive regions PXA-R, PXA-G, and PXA-B may have various shapes in the plan view. In an embodiment, the first to third emissive regions PXA-R, PXA-G, and PXA-B may have a polygonal, circular, or oval shape, for example. FIG. 5 illustrates the first and third emissive regions PXA-R and PXA-B having a quadrangular shape (or, a rhombic shape) in the plan view and the second emissive regions PXA-G having an octagonal shape in the plan view.

The first to third emissive regions PXA-R, PXA-G, and PXA-B may have the same shape in the plan view, or at least some of the first to third emissive regions PXA-R, PXA-G, and PXA-B may have different shapes. FIG. 5 illustrates the first and third emissive regions PXA-R and PXA-B having the same shape in the plan view and the second emissive regions PXA-G having a shape different from those of the first and third emissive regions PXA-R and PXA-B.

At least some of the first to third emissive regions PXA-R, PXA-G, and PXA-B may have different areas in the plan view. In an embodiment, the area of the first emissive region PXA-R emitting red light may be greater than the area of the second emissive region PXA-G emitting green light and may be smaller than the area of the third emissive region PXA-B emitting blue light. However, the relative size relationship between the first to third emissive regions PXA-R, PXA-G, and PXA-B depending on emission colors is not limited thereto and may vary depending on the design of the display module DM (refer to FIG. 3). Furthermore, without being limited thereto, the first to third emissive regions PXA-R, PXA-G, and PXA-B may have the same area in the plan view.

The shapes, areas, and arrangement of the first to third emissive regions PXA-R, PXA-G, and PXA-B of the display module DM (refer to FIG. 3) of the disclosure may be diversely designed depending on the colors of emitted light beams or the size and configuration of the display module DM (refer to FIG. 3) and are not limited to the embodiment illustrated in FIG. 5.

Figure 7:
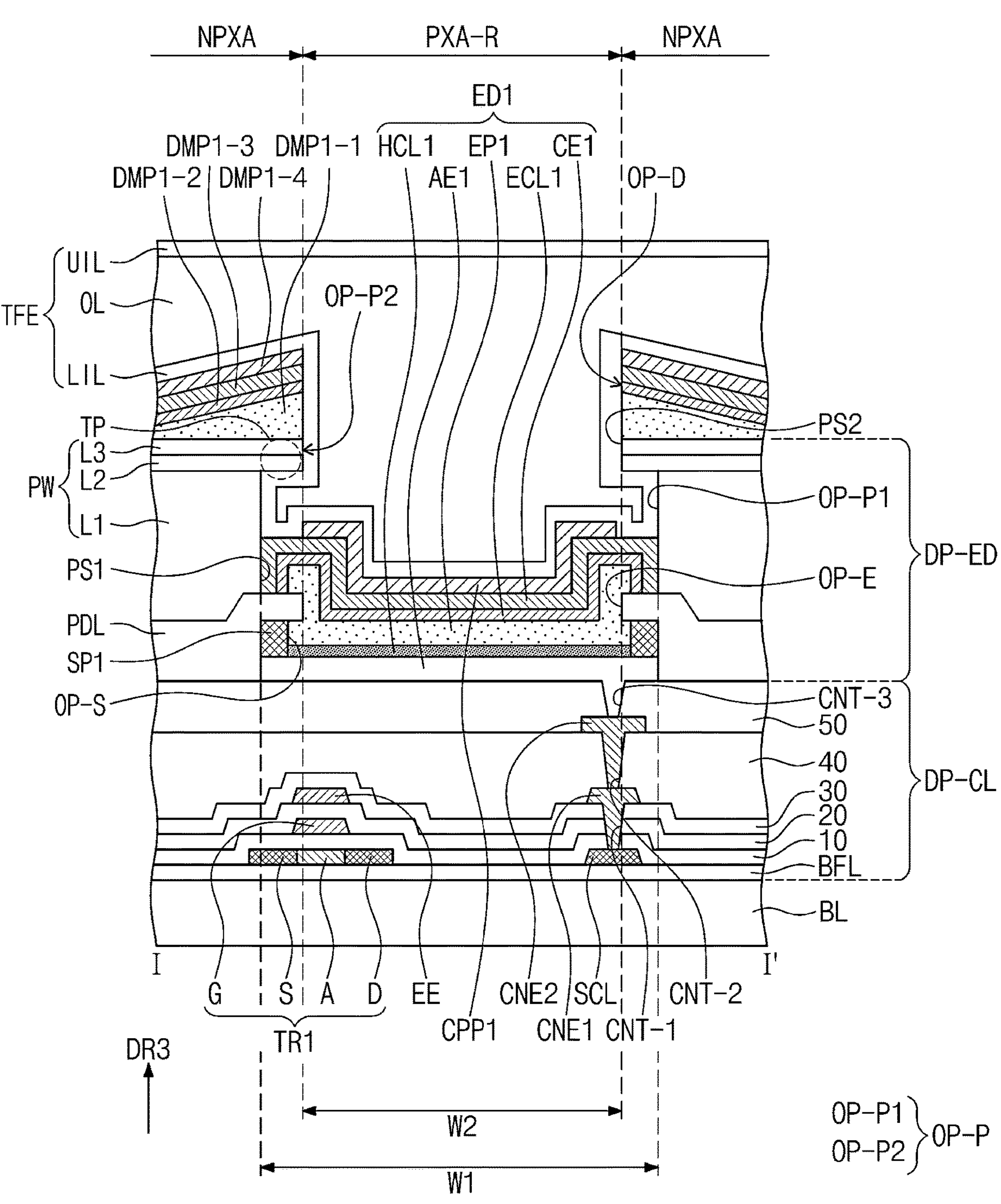
FIG. 7 is an enlarged view of a first light-emitting element of FIG. 6.

FIG. 6 is a cross-sectional view taken along line I-I' illustrated in FIG. 5. FIG. 7 is an enlarged view of the first light-emitting element of FIG. 6.

FIG. 7 is a cross-sectional view illustrating the first light-emitting element.

Referring to FIGS. 6 and 7, the display panel DP may include the base layer BL, the circuit element layer DP-CL, the display element layer DP-ED, and the thin film encapsulation layer TFE that are sequentially stacked one above another.

The display layer DP may include a plurality of insulating layers, a semiconductor pattern, a conductive pattern, and a signal line. An insulating layer, a semiconductor layer, and a conductive layer may be formed by coating, deposition, or the like. Thereafter, the insulating layer, the semiconductor layer, and the conductive layer may be selectively subjected to patterning by photolithography and etching. The semiconductor pattern, the conductive pattern, and the signal line included in the circuit element layer DP-CL and the display element layer DP-ED may be formed by the above-described method.

Referring to FIG. 7, the circuit element layer DP-CL may be disposed on the base layer BL. The circuit element layer DP-CL may include a buffer layer BFL, a transistor TR1, a signal transmission region SCL, first to fifth insulating layers 10, 20, 30, 40, and 50, an electrode EE, and a plurality of connecting electrodes CNE1 and CNE2.

The buffer layer BFL may be disposed on the base layer BL. The semiconductor pattern may include poly-silicon. However, without being limited thereto, the semiconductor pattern may include amorphous silicon or metal oxide.

FIG. 7 illustrates only a portion of the semiconductor pattern, and the semiconductor pattern may be additionally disposed in the plurality of emissive regions PXA-R, PXA-G, and PXA-B. The semiconductor pattern may be arranged across the plurality of emissive regions PXA-R, PXA-G, and PXA-B according to a predetermined rule. The semiconductor pattern may have different electrical properties depending on whether the semiconductor pattern is doped or not. The semiconductor pattern may include a first region having a relatively high doping concentration and a second region having a relatively low doping concentration. The first region may be doped with an N-type dopant or a P-type dopant. A P-type transistor may include a first region doped with a P-type dopant.

The first region may have a higher conductivity than that of the second region and may substantially serve as an electrode or a signal line. The second region may substantially correspond to an active (or, channel) region of the transistor TR1. In other words, one portion of the semiconductor pattern may be the active region of the transistor TR1, another portion may be a source or drain of the transistor TR1, and another portion may be a conductive region.

A source S, an active region A, and a drain D of the transistor TR1 may be formed from the semiconductor pattern. Although not illustrated, the signal transmission region SCL may be connected to the drain D of the transistor TR1 in the plan view.

The one transistor TR1 is illustrated as an example. However, substantially, the display panel DP may include a plurality of transistors and at least one capacitor for driving the light-emitting elements ED1, ED2 and ED3 that will be described below. The plurality of transistors and the at least one capacitor may be connected together.

The first to fifth insulating layers 10, 20, 30, 40, and 50 may be disposed on the buffer layer BFL. The first to fifth insulating layers 10, 20, 30, 40, and 50 may be inorganic layers or organic layers.

The first insulating layer 10 may be disposed on the buffer layer BFL. The first insulating layer 10 may cover the semiconductor pattern of the transistor TR1.

A gate G may be disposed on the first insulating layer 10. The gate G may overlap the active region A in the plan view. In an embodiment, the gate G may function as a mask in a process of doping the semiconductor pattern.

The second insulating layer 20 may cover the first insulating layer 10 and the gate G. The electrode EE may be disposed on the second insulating layer 20. The third insulating layer 30 may be disposed on the second insulating layer 20 and may cover the electrode EE.

The first connecting electrode CNE1 may be disposed on the third insulating layer 30. The first connecting electrode CNE1 may be connected to the signal transmission region SCL through a contact hole CNT-1 penetrating the first to third insulating layers 10, 20, and 30. The fourth insulating layer 40 may be disposed on the third insulating layer 30 and may cover the first connecting electrode CNE1. The fourth insulating layer 40 may be an organic layer.

The second connecting electrode CNE2 may be disposed on the fourth insulating layer 40. The second connecting electrode CNE2 may be connected to the first connecting electrode CNE1 through a contact hole CNT-2 penetrating the fourth insulating layer 40. The fifth insulating layer 50 may be disposed on the fourth insulating layer 40 and may cover the second connecting electrode CNE2. The fifth insulating layer 50 may be an organic layer.

Referring to FIGS. 6 and 7, the display element layer DP-ED may be disposed on the circuit element layer DP-CL. The display element layer DP-ED may include the light-emitting elements ED1, ED2, and ED3, a pixel defining layer PDL, a barrier wall PW, capping patterns CPP, and a dummy part DMP.

Although each of the pixel defining layer PDL, the dummy part DMP, and the barrier wall PW is illustrated in plural numbers in FIGS. 6 and 7, each of the pixel defining layer PDL, the dummy part DMP, and the barrier wall PW may be substantially unitary when viewed from above the plane. The pixel defining layer PDL may be disposed on the fifth insulating layer 50 of the circuit element layer DP-CL. The pixel defining layer PDL may define the light-emitting openings OP-E.

The pixel defining layer PDL may include an inorganic insulating material. In an embodiment, the pixel defining layer PDL may include silicon nitride SiNx, for example. The pixel defining layer PDL may be disposed between the first electrodes AE and the barrier wall PW, which will be described below, and may block electrical connection between the first electrodes AE and the barrier wall PW.

The first to third light-emitting elements ED1, ED2, and ED3 may include the first electrodes AE (or the anodes or the pixel electrodes), hole control layers HCL, emission patterns EP, electron control layers ECL, and second electrodes CE (or cathodes or a common electrode).

The first electrodes AE may be disposed on the circuit element layer DP-CL. Each of the first electrodes AE may be disposed in a corresponding light-emitting opening OP-E among the light-emitting openings OP-E defined by the pixel defining layer PDL. At least portions of the first electrodes AE may be exposed through the light-emitting openings OP-E.

The first electrodes AE may include an 1-1 electrode AE1, an 1-2 electrode AE2, and an 1-3 electrode AE3. The 1-1 electrode AE1 may overlap the first emissive region PXA-R. The 1-2 electrode AE2 may overlap the second emissive region PXA-G. The 1-3 electrode AE3 may overlap the third emissive region PXA-B.

Referring to FIG. 7, the 1-1 electrode AE1 may be connected to the second connecting electrode CNE2 by a connection contact hole CNT-3 defined to penetrate the fifth insulating layer 50. Accordingly, the 1-1 electrode AE1 may be electrically connected to the signal transmission region SCL through the first and second connecting electrodes CNE1 and CNE2 and may be electrically connected to a corresponding circuit element. Furthermore, the 1-1 electrode AE1 may be connected to the transistor TR1 and may be connected to a plurality of other transistors and the at least one capacitor accordingly. Although not illustrated, the 1-2 electrode AE2 and the 1-3 electrode AE3 of FIG. 6 may also have the same structure.

Referring to FIGS. 6 and 7, the display panel DP may further include sacrificial patterns SP. The sacrificial patterns SP may be disposed on the upper surfaces of the first electrodes AE. Sacrificial openings OP-S that expose portions of the upper surfaces of the first electrodes AE may be defined in the sacrificial patterns SP. The sacrificial patterns SP may include amorphous transparent conductive oxide.

The light-emitting openings OP-E may have a smaller width in one direction than that of the sacrificial openings OP-S. The one direction may be defined as a direction perpendicular to the thickness direction of the display panel DP (that is, the third direction DR3). Inner surfaces of the pixel defining layer PDL that define the light-emitting openings OP-E may be closer to the centers of the first electrodes AE than inner surfaces of the sacrificial patterns SP that define the sacrificial openings OP-S are to the centers of the first electrodes AE.

However, without being limited thereto, the inner surfaces of the sacrificial patterns SP that define the sacrificial openings OP-S may be substantially aligned with the inner surfaces of the pixel defining layer PDL that define the corresponding light-emitting openings OP-E. In this case, the first to third emissive regions PXA-R, PXA-G, and PXA-B may be defined as regions of the first electrodes AE exposed from the corresponding sacrificial openings OP-S. In an embodiment of the disclosure, the sacrificial patterns SP may be omitted.

The sacrificial patterns SP may include a first sacrificial pattern SP1, a second sacrificial pattern SP2, and a third sacrificial pattern SP3. Although each of the first sacrificial pattern SP1, the second sacrificial pattern SP2, and the third sacrificial pattern SP3 is illustrated in plural numbers in FIGS. 6 and 7, each of the first sacrificial pattern SP1, the second sacrificial pattern SP2, and the third sacrificial pattern SP3 may be substantially unitary when viewed from above the plane.

The first sacrificial pattern SP1 may be disposed on the 1-1 electrode AE1. The second sacrificial pattern SP2 may be disposed on the 1-2 electrode AE2. The third sacrificial pattern SP3 may be disposed on the 1-3 electrode AE3.

The barrier wall PW may be disposed on the pixel defining layer PDL. Although the barrier wall PW is illustrated in plural numbers in FIGS. 6 and 7, the barrier wall PW may be substantially unitary when viewed from above the plane. The barrier wall PW may have an undercut shape on the section. The barrier wall PW may include multiple layers sequentially stacked one above another, and at least one layer among the multiple layers may be depressed when compared to layers stacked adjacent thereto. Accordingly, the barrier wall PW may define tip portions TP.

The barrier wall PW may include a first barrier wall layer L1, a second barrier wall layer L2, and a third barrier wall layer L3. The first barrier wall layer L1 may be disposed on the pixel defining layer PDL, the second barrier wall layer L2 may be disposed on the first barrier wall layer L1, and the third barrier wall layer L3 may be disposed on the second barrier wall layer L2.

As illustrated in FIGS. 6 and 7, the thickness of the first barrier wall layer L1 may be greater than the thicknesses of the second and third barrier wall layers L2 and L3, and the thicknesses of the second barrier wall layer L2 and the third barrier wall layer L3 may be the same as each other. However, the disclosure is not limited thereto.

When compared to the second and third barrier wall layers L2 and L3, the first barrier wall layer L1 may be relatively depressed with respect to the first to third emissive regions PXA-R, PXA-G, and PXA-B. The first barrier wall layer L1 may be undercut with respect to the second barrier wall layer L2 and the third barrier wall layer L3. The second and third barrier wall layers L2 and L3 may extend so as to be closer to the centers of the first electrodes AE than the first barrier wall layer L1 is to the centers of the first electrodes AE.

Portions of the second barrier wall layer L2 that protrude from the first barrier wall layer L1 toward the first to third emissive regions PXA-R, PXA-G, and PXA-B and portions of the third barrier wall layer L3 that protrude from the first barrier wall layer L1 toward the first to third emissive regions PXA-R, PXA-G, and PXA-B may be defined as the tip portions TP in the barrier wall PW.

The barrier wall PW may define barrier wall openings OP-P. The barrier wall openings OP-P may correspond to the light-emitting openings OP-E and may expose at least portions of the first electrodes AE.

The barrier wall openings OP-P may include first barrier wall openings OP-P1 and second barrier wall openings OP-P2. The first barrier wall openings OP-P1 may be defined by the first barrier wall layer L1. The first barrier wall layer L1 may include first inner surfaces PS1 that define the first barrier wall openings OP-P1.

The second barrier wall openings OP-P2 may be defined by the second and third barrier wall layers L2 and L3. The second and third barrier wall layers L2 and L3 may include second inner surfaces PS2 that define the second barrier wall openings OP-P2. The second inner surfaces PS2 may be defined as surfaces formed by inner surfaces of the second barrier wall layer L2 and the third barrier wall layer L3.

On the section, the widths W2 of the second barrier wall openings OP-P2 in the one direction may be smaller than the widths W1 of the first barrier wall openings OP-P1 in the one direction.

In an embodiment, the first inner surfaces PS1 and the second inner surfaces PS2 are illustrated as being perpendicular to an upper surface of the fifth insulating layer 50, for example. However, without being limited thereto, each of the first to third barrier wall layers L1, L2, and L3 may have a tapered shape or an inverted tapered shape.

In an embodiment of the disclosure, each of the first barrier wall layer L1, the second barrier wall layer L2, and the third barrier wall layer L3 may include a conductive material. In an embodiment, the conductive material may include metal, metal nitride, transparent conductive oxide ("TCO"), or any combinations thereof, for example. In an embodiment, the metal may include gold (Au), silver (Ag), aluminum (Al), magnesium (Mg), lithium (Li), molybdenum (Mo), titanium (Ti), copper (Cu), or an alloy, for example. The metal nitride may include titanium nitride (TiN). The transparent conductive oxide may include indium tin oxide ("ITO"), indium zinc oxide ("IZO"), zinc oxide, indium oxide, indium gallium oxide, indium gallium zinc oxide ("IGZO"), or aluminum zinc oxide.

In an alternative embodiment, in an embodiment of the disclosure, the first barrier wall layer L1 may include an insulating material, and each of the second barrier wall layer L2 and the third barrier wall layer L3 may include a conductive material. In an embodiment, the first barrier wall layer L1 may include an inorganic insulating material and may include, e.g., silicon nitride (SiNx) or silicon oxide (SiOx).

In an embodiment, the second barrier wall layer L2 and the third barrier wall layer L3 may include different materials from each other. In this case, the third barrier wall layer L3 may have a higher modulus than that of the second barrier wall layer L2. Accordingly, portions of the second barrier wall layer L2 that define the tip portions TP may be prevented from being curved or broken by components formed thereabove. Thus, the display panel DP having improved process reliability may be provided.

In an embodiment, the second barrier wall layer L2 may include titanium nitride (TiN), and the third barrier wall layer L3 may include titanium (Ti), for example. When the second barrier wall layer L2 includes titanium nitride (TiN), the titanium nitride (TiN) may not form an oxide film at the interface. Furthermore, since titanium (Ti) has a higher modulus than titanium nitride (TiN), damage to the second barrier wall layer L2 may be prevented when the third barrier wall layer L3 includes titanium (Ti).

The third barrier wall layer L3 may be omitted in a case in which the second barrier wall layer L2 has a sufficient modulus so as not to be damaged by components formed thereabove.

The hole control layers HCL may be disposed on the first electrodes AE. The hole control layers HCL may be disposed in the sacrificial openings OP-S.

The hole control layers HCL may include a first hole control layer HCL1, a second hole control layer HCL2, and a third hole control layer HCL3. The first hole control layer HCL1 may be disposed on the 1-1 electrode AE1. The second hole control layer HCL2 may be disposed on the 1-2 electrode AE2. The third hole control layer HCL3 may be disposed on the 1-3 electrode AE3.

The hole control layers HCL may further include a hole injection layer ("HIL") and a hole transport layer ("HTL").

The emission patterns EP may be disposed on the first electrodes AE and the hole control layers HCL. The hole control layers HCL may be disposed between the first electrodes AE and the emission patterns EP. The emission patterns EP may be deposited by the metal mask MMK (refer to FIG. 8H). The deposition of the emission patterns EP will be described in detail with reference to FIG. 8G.

At least portions of the emission patterns EP may be disposed in the light-emitting openings OP-E. All of the emission patterns EP may be disposed in the light-emitting openings OP-E, or the emission patterns EP may be disposed in the barrier wall openings OP-P as well as the light-emitting openings OP-E. In the embodiment in which the display panel DP includes the sacrificial patterns SP, the emission patterns EP may also be disposed in the sacrificial openings OP-S.

The emission patterns EP may include an emissive layer including a luminescent material. The emission patterns EP may include an organic material.

The electron control layers ECL may be disposed on the emission patterns EP. The electron control layers ECL may be subjected to patterning by the tip portions TP defined in the barrier wall PW. The electron control layers ECL may cover the emission patterns EP.

The emission patterns EP may include a first emission pattern EP1, a second emission pattern EP2, and a third emission pattern EP3. The first emission pattern EP1 may be disposed on the first hole control layer HCL1. The second emission pattern EP2 may be disposed on the second hole control layer HCL2. The third emission pattern EP3 may be disposed on the third hole control layer HCL3.

In an embodiment, the first emission pattern EP1 may generate red light, for example. The second emission pattern EP2 may generate green light. The third emission pattern EP3 may generate blue light.

Portions of the electron control layers ECL may be disposed in the light-emitting openings OP-E. Portions of the electron control layers ECL may be disposed in the barrier wall openings OP-P.

The electron control layers ECL may include an electron transport layer ("ETL") and an electron injection layer ("EIL").

The electron control layers ECL may be formed without using the metal mask MMK. The formation of the electron control layers ECL will be described in detail with reference to FIG. 8J.

The second electrodes CE may be disposed on the electron control layers ECL. The electron control layers ECL may be disposed between the emission patterns EP and the second electrodes CE. The second electrodes CE may be subjected to patterning by the tip portions TP defined in the barrier wall PW. The second electrodes CE may be deposited without using the metal mask MMK. The deposition of the second electrodes CE will be described in detail with reference to FIG. 8K.

At least portions of the second electrodes CE may be disposed in the barrier wall openings OP-P. In an embodiment of the disclosure, portions of the second electrodes CE may also be disposed in the light-emitting openings OP-E depending on the thicknesses of the emission patterns EP or the thickness of the pixel defining layer PDL.

As long as the second electrodes CE are capable of having conductivity, the second electrodes CE may include or consist of various materials such as metal, transparent conductive oxide ("TCO"), or a conductive polymer material.

The second electrodes CE may contact the first inner surfaces PS1 of the barrier wall PW. Specifically, the second electrodes CE may be electrically connected to the first barrier wall layer L1 by contacting the first barrier wall layer L1. The second electrodes CE may receive a bias voltage applied to the barrier wall PW. That is, the second electrodes CE may be connected to the barrier wall PW and may receive a common voltage. In this case, as the first barrier wall layer L1 having relatively high electrical conductivity has a relatively large thickness and is brought into contact with the second electrodes CE, the drive resistance of the first to third light-emitting elements ED1, ED2, and ED3 may be decreased. A common driving voltage may be provided to the first to third light-emitting elements ED1, ED2, and ED3 without a deviation. Accordingly, the light emission efficiency and lifetime of the display panel DP may be increased.

The second electrodes CE may include an 2-1 electrode CE1, an 2-2 electrode CE2, and an 2-3 electrode CE3. The 2-1 electrode CE1 may be disposed over the 1-1 electrode AE1. The 2-2 electrode CE2 may be disposed over the 1-2 electrode AE2. The 2-3 electrode CE3 may be disposed over the 1-3 electrode AE3.

Each of the capping patterns CPP may be disposed on a corresponding second electrode CE among the second electrodes CE. The capping patterns CPP may be subjected to patterning by the tip portions TP defined in the barrier wall PW. At least portions of the capping patterns CPP may be disposed in the barrier wall openings OP-P. Although the at least portions of the capping patterns CPP are disposed in the barrier wall openings OP-P in FIGS. 6 and 7, the capping patterns CPP may be disposed only in the barrier wall openings OP-P depending on the thicknesses of the emission patterns EP or the thickness of the pixel defining layer PDL.

The electron control layers ECL, the second electrodes CE, and the capping patterns CPP may be simultaneously formed on the first to third emission patterns EP1 to EP3. The formation of the electron control layers ECL, the second electrodes CE, and the capping patterns CPP will be described in detail with reference to FIGS. 8K to 8M.

The dummy part DMP may be disposed on the barrier wall PW. Although the dummy part DMP is illustrated in plural numbers in FIGS. 6 and 7, the dummy part DMP may be substantially unitary. The dummy part DMP may have an inclined upper surface. The height of the upper surface of the dummy part DMP may be lowered toward the center of the barrier wall PW.

The dummy part DMP may include first dummy layers DMP1, a second dummy layer DMP2, a third dummy layer DMP3, and a fourth dummy layer DMP4. The first to fourth dummy layers DMP1 to DMP4 may be sequentially stacked in the third direction DR3. The dummy part DMP may not be separated on the barrier wall PW.

The first dummy layers DMP1 may include an organic material. The first dummy layers DMP1 may include the same material as that of the emission patterns EP. Specifically, 1-1 dummy layers DMP1-1 may include the same material as that of the first emission pattern EP1. In an embodiment, 2-1 dummy layers DMP2-1 may include the same material as that of the second emission pattern EP2. In an embodiment, 3-1 dummy layers DMP3-1 may include the same material as that of the third emission pattern EP3.

The first dummy layers DMP1 may be simultaneously formed together with the emission patterns EP through one process. The first dummy layers DMP1 may be formed by the metal mask MMK (refer to FIG. 8H). The formation of the first dummy layers DMP1 will be described in detail with reference to FIGS. 8H and 81.

Each of the first dummy layers DMP1 may have an inclined upper surface. The height of the upper surface of the first dummy layer DMP1 may be lowered toward the center of the barrier wall PW.

The first dummy layers DMP1 may include the 1-1 dummy layers DMP1-1, the 2-1 dummy layers DMP2-1, and the 3-1 dummy layers DMP3-1. The 1-1 dummy layers DMP1-1 may be adjacent to the first emissive region PXA-R. The 2-1 dummy layers DMP2-1 may be adjacent to the second emissive region PXA-G. The 3-1 dummy layers DMP3-1 may be adjacent to the third emissive region PXA-B.

The first dummy layers DMP1 adjacent to each other may face each other with respect to the center of the barrier wall PW. Specifically, the 1-1 dummy layers DMP1-1 may face the 2-1 dummy layers DMP2-1. The 2-1 dummy layers DMP2-1 may face the 3-1 dummy layers DMP3-1.

The second dummy layer DMP2 may be disposed on the first dummy layers DMP1. Although the second dummy layer DMP2 is illustrated in plural numbers in FIGS. 6 and 7, the second dummy layer DMP2 may be substantially unitary.

The second dummy layer DMP2 may include a 1-2 dummy layer DMP1-2, a 2-2 dummy layer DMP2-2, and a 3-2 dummy layer DMP3-2. The 1-2 dummy layer DMP1-2 may be adjacent to the first emissive region PXA-R. The 2-2 dummy layer DMP2-2 may be adjacent to the second emissive region PXA-G. The 3-2 dummy layer DMP3-2 may be adjacent to the third emissive region PXA-B.

The second dummy layer DMP2 may include the same material as that of the electron control layers ECL. Specifically, the 1-2 dummy layer DMP1-2 may include the same material as a first electron control layer ECL1. The 2-2 dummy layer DMP2-2 may include the same material as a second electron control layer ECL2. The 3-2 dummy layer DMP3-2 may include the same material as a third electron control layer ECL3.

The second dummy layer DMP2 may be simultaneously formed together with the electron control layers ECL through one process. The second dummy layer DMP2 may be separated from the electron control layers ECL by the undercut shape of the barrier wall PW. The formation of the second dummy layer DMP2 will be described in detail with reference to FIG. 8K.

The second dummy layer DMP2 may have an inclined upper surface. The height of the upper surface of the second dummy layer DMP2 may be lowered toward the center of the barrier wall PW.

The second dummy layer DMP2 may not be separated on the barrier wall PW. In an embodiment, the 1-2 dummy layer DMP1-2 may be connected with the 2-2 dummy layer DMP2-2 adjacent thereto, for example. The 2-2 dummy layer DMP2-2 may be connected with the 3-2 dummy layer DMP3-2 adjacent thereto.

The third dummy layer DMP3 may be disposed on the second dummy layer DMP2. Although the third dummy layer DMP3 is illustrated in plural numbers in FIGS. 6 and 7, the third dummy layer DMP3 may be substantially unitary.

The third dummy layer DMP3 may include a 1-3 dummy layer DMP1-3, a 2-3 dummy layer DMP2-3, and a 3-3 dummy layer DMP3-3. The 1-3 dummy layer DMP1-3 may be adjacent to the first emissive region PXA-R. The 2-3 dummy layer DMP2-3 may be adjacent to the second emissive region PXA-G. The 3-3 dummy layer DMP3-3 may be adjacent to the third emissive region PXA-B.

The third dummy layer DMP3 may include a conductive material. In an embodiment, the third dummy layer DMP3 may include the same material as that of the second electrodes CE. Specifically, the 1-3 dummy layer DMP1-3 may include the same material as that of the 2-1 electrode CE1, for example. The 2-3 dummy layer DMP2-3 may include the same material as that of the 2-2 electrode CE2. The 3-3 dummy layer DMP3-3 may include the same material as that of the 2-3 electrode CE3.

The third dummy layer DMP3 may be simultaneously formed together with the second electrodes CE through one process. The third dummy layer DMP3 may be separated from the second electrodes CE by the undercut shape of the barrier wall PW. The formation of the third dummy layer DMP3 will be described in detail with reference to FIG. 8L.

The third dummy layer DMP3 may have an inclined upper surface. The height of the upper surface of the third dummy layer DMP3 may be lowered toward the center of the barrier wall PW.

The third dummy layer DMP3 may not be separated on the barrier wall PW. In an embodiment, the 1-3 dummy layer DMP1-3 may be connected with the 2-3 dummy layer DMP2-3 adjacent thereto, for example. The 2-3 dummy layer DMP2-3 may be connected with the 3-3 dummy layer DMP3-3 adjacent thereto.

The fourth dummy layer DMP4 may be disposed on the third dummy layer DMP3. Although the fourth dummy layer DMP4 is illustrated in plural numbers in FIGS. 6 and 7, the fourth dummy layer DMP4 may be substantially unitary.

The fourth dummy layer DMP4 may include a 1-4 dummy layer DMP1-4, a 2-4 dummy layer DMP2-4, and a 3-4 dummy layer DMP3-4. The 1-4 dummy layer DMP1-4 may be adjacent to the first emissive region PXA-R. The 2-4 dummy layer DMP2-4 may be adjacent to the second emissive region PXA-G. The 3-4 dummy layer DMP3-4 may be adjacent to the third emissive region PXA-B.

The fourth dummy layer DMP4 may include the same material as that of the capping patterns CPP. Specifically, the 1-4 dummy layer DMP1-4 may include the same material as a first capping pattern CPP1. The 2-4 dummy layer DMP2-4 may include the same material as a second capping pattern CPP2. The 3-4 dummy layer DMP3-4 may include the same material as a third capping pattern CPP3.

The fourth dummy layer DMP4 may be simultaneously formed together with the capping patterns CPP through one process and may be separated from the capping patterns CPP by the undercut shape of the barrier wall PW. The formation of the fourth dummy layer DMP4 will be described in detail with reference to FIG. 8M.

The fourth dummy layer DMP4 may have an inclined upper surface. The height of the upper surface of the fourth dummy layer DMP4 may be lowered toward the center of the barrier wall PW. The fourth dummy layer DMP4 may not have a step on the barrier wall PW.

Dummy openings OP-D corresponding to the light-emitting openings OP-E may be defined by the dummy part DMP. The dummy openings OP-D may be defined by inner surfaces of the first to fourth dummy layers DMP1 to DMP4. On the plane, the dummy part DMP may have a closed-line shape extending along the outer boundaries of the first to third emissive regions PXA-R, PXA-G, and PXA-B.

The thin film encapsulation layer TFE may be disposed on the display element layer DP-ED. The thin film encapsulation layer TFE may be disposed on the barrier wall PW. The thin film encapsulation layer TFE may not be separated on the barrier wall PW.

The thin film encapsulation layer TFE may include a first inorganic layer LIL, an organic layer OL, and a second inorganic layer UIL. The first inorganic layer LIL may cover the light-emitting elements ED1, ED2, and ED3 and the dummy part DMP. Specifically, the first inorganic layer LIL may cover the second electrodes CE and the capping patterns CPP. The first inorganic layer LIL may cover the dummy part DMP disposed on the barrier wall PW. The first inorganic layer LIL may not be separated on the barrier wall PW.

Portions of the first inorganic layer LIL may be disposed in the light-emitting openings OP-E and the barrier wall openings OP-P. The other portions of the first inorganic layer LIL may be disposed on the barrier wall PW. The first inorganic layer LIL may be brought into contact with the upper surface of the dummy part DMP and the inner surfaces of the dummy part DMP that define the dummy openings OP-D.

The first inorganic layer LIL may have an inclined surface corresponding to the upper surface of the dummy part DMP. The height of the upper surface of the first inorganic layer LIL may be lowered toward the center of the barrier wall PW.

The organic layer OL may cover the first inorganic layer LIL and may provide a flat upper surface. The second inorganic layer UIL may be disposed on the organic layer OL.

The first inorganic layer LIL and the second inorganic layer UIL may protect the display element layer DP-ED from moisture/oxygen, and the organic layer OL may protect the display element layer DP-ED from foreign matter such as dust particles.

Figure 8A:
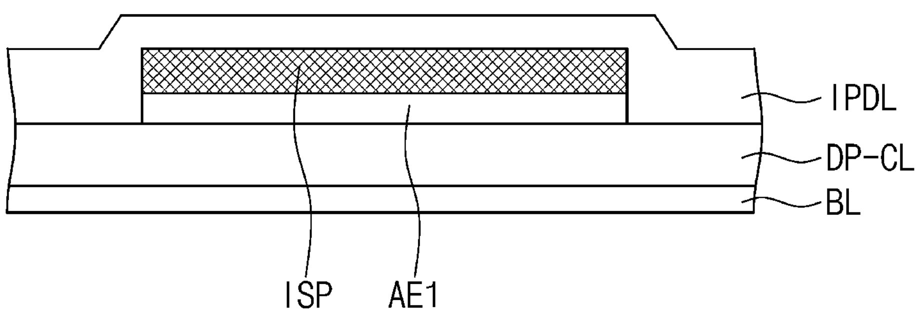
FIGS. 8A to 8O are views for explaining a method of manufacturing the display panel illustrated in FIG. 6.

FIGS. 8A to 8O are views for explaining a method of manufacturing the display panel illustrated in FIG. 6.

Components identical or similar to the components described with reference to FIGS. 1 to 7 will be assigned with identical or similar reference numerals, and repetitive descriptions will hereinafter be omitted.

Although FIGS. 8A to 81 illustrate a method of forming the first emission pattern EP1, the second emission pattern EP2 (refer to FIG. 6) and the third emission pattern EP3 (Refer to FIG. 6) may also be formed by substantially the same method.

Referring to FIG. 8A, the circuit element layer DP-CL may be disposed on the base layer BL. The circuit element layer DP-CL may be formed through a conventional circuit element manufacturing process of forming an insulating layer, a semiconductor layer, and a conductive layer by coating, deposition, or the like and forming a semiconductor pattern, a conductive pattern, and a signal line by selectively making the insulating layer, the semiconductor layer, and the conductive layer subject to patterning by photolithography and etching processes.

The 1-1 electrode AE1 may be disposed on the circuit element layer DP-CL. A preliminary sacrificial pattern ISP may be disposed on the 1-1 electrode AE1. The 1-1 electrode AE1 and the preliminary sacrificial pattern ISP may be formed by the same patterning process.

A preliminary pixel defining layer IPDL may be disposed on the preliminary sacrificial pattern ISP and the circuit element layer DP-CL. The preliminary pixel defining layer IPDL may cover the preliminary sacrificial pattern ISP and the 1-1 electrode AE1.

Figure 8B:
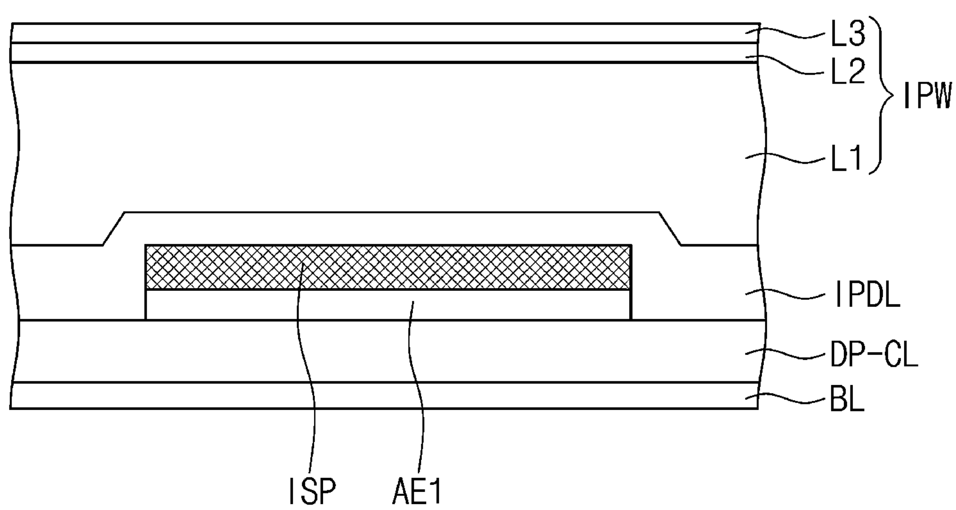

Referring to FIG. 8B, the manufacturing method may include an operation of forming a preliminary barrier wall IPW including the first to third barrier wall layers L1, L2 and L3 on the preliminary pixel defining layer IPDL.

The operation of forming the preliminary barrier wall PW may include an operation of forming the first barrier wall layer L1 on the preliminary pixel defining layer IPDL, an operation of forming the second barrier wall layer L2 on the first barrier wall layer L1, and an operation of forming the third barrier wall layer L3 on the second barrier wall layer L2. Each of the operation of forming the first barrier wall layer L1, the operation of forming the second barrier wall layer L2, and the operation of forming the third barrier wall layer L3 may be performed through a deposition process.

The operation of forming the first barrier wall layer L1 may be performed through a process of depositing a conductive material or a process of depositing an insulating material.

When the operation of forming the first barrier wall layer L1 is performed through the process of depositing the conductive material, the operation may be performed through a sputtering deposition process. When the operation of forming the first barrier wall layer L1 is performed through the process of depositing the insulating material, the operation may be performed through a chemical vapor deposition ("CVD") process.

Each of the operation of forming the second barrier wall layer L2 and the operation of forming the third barrier wall layer L3 may be performed through a process of depositing a conductive material. Each of the operation of forming the second barrier wall layer L2 and the operation of forming the third barrier wall layer L3 may be performed through a sputtering deposition process.

In an embodiment, the preliminary barrier wall IPW that includes the first barrier wall layer L1 including or consisting of aluminum (Al), the second barrier wall layer L2 including or consisting of titanium nitride (TiN), and the third barrier wall layer L3 including or consisting of titanium (Ti) may be formed.

In an embodiment according to the disclosure, the operation of forming the third barrier wall layer L3 may be omitted, and the preliminary barrier wall IPW may include only the first and second barrier wall layers L1 and L2.

Figure 8C:
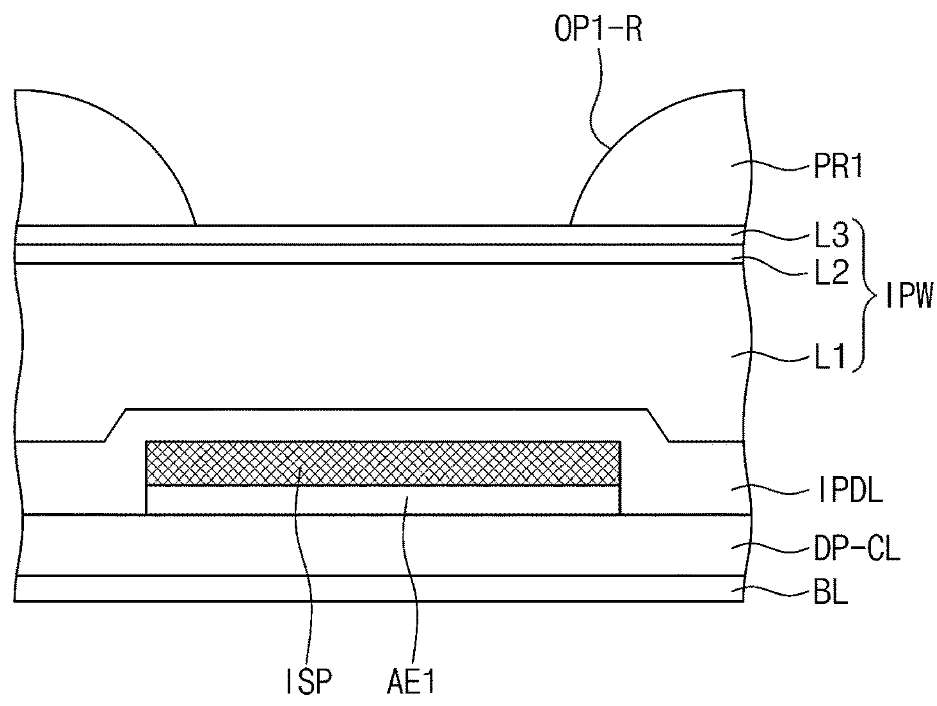

Referring to FIG. 8C, a first photoresist layer PR1 may be disposed on the preliminary barrier wall IPW. The first photoresist layer PR1 may be formed by forming a preliminary photoresist layer on the preliminary barrier wall IPW and thereafter making the preliminary photoresist layer subject to patterning by a photo mask. Through the patterning process, a first photo opening OP1-R overlapping the 1-1 electrode AE1 may be defined in the first photoresist layer PR1.

Figure 8D:
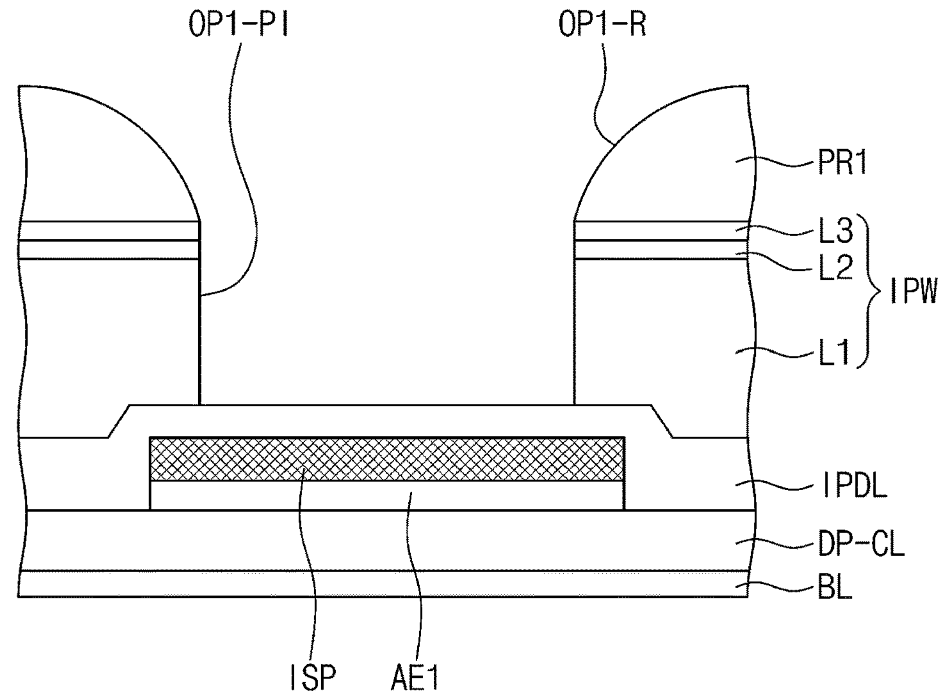
Figure 8E:
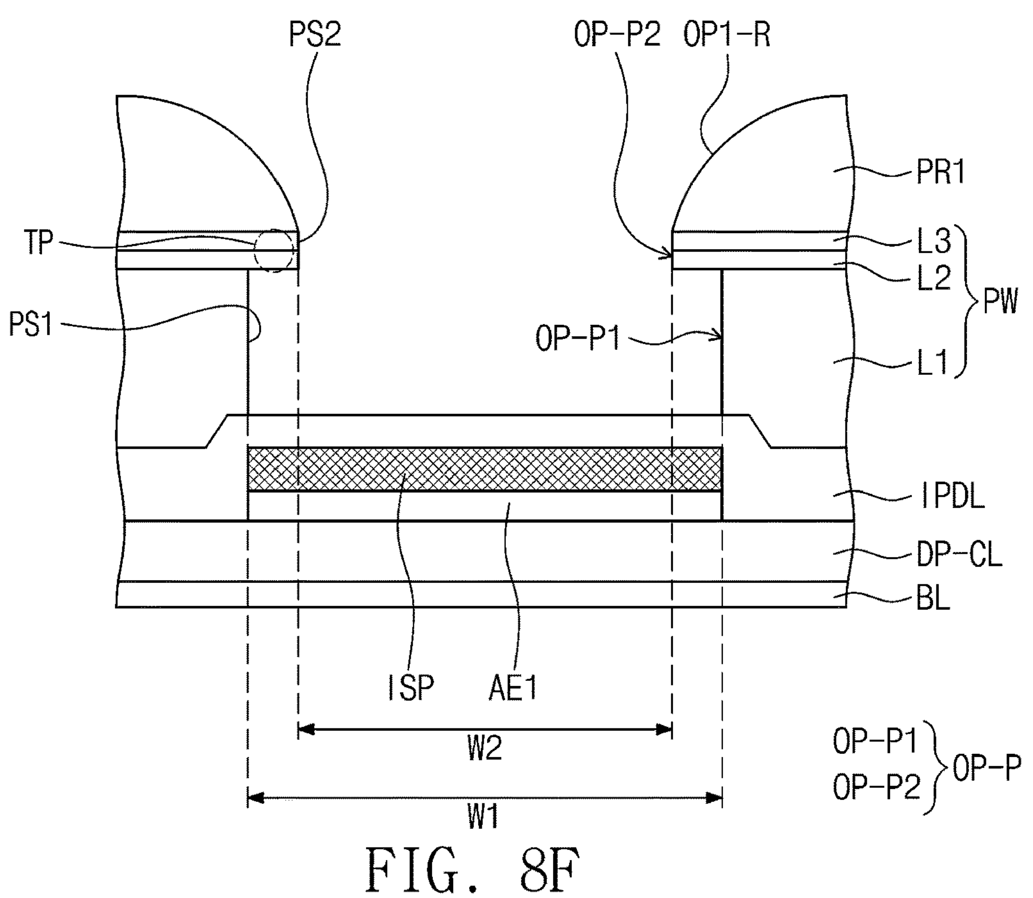

Referring to FIGS. 8D and 8E, the manufacturing method of the display panel DP may include an operation of making the first to third barrier wall layers L1, L2, and L3 subject to patterning such that the barrier wall PW is formed from the preliminary barrier wall IPW. In this embodiment, the operation of making the first to third barrier wall layers L1, L2, and L3 subject to patterning may be performed through two etching processes.

First, as illustrated in FIG. 8D, the operation of making the first to third barrier wall layers L1, L2, and L3 subject to patterning may include a first etching operation of firstly etching the first to third barrier wall layers L1, L2, and L3. In the first etching operation, a preliminary barrier wall opening OP1-P1 may be defined in the preliminary barrier wall IPW by the first photoresist layer PR1 as a mask. The first etching operation may be performed through a dry etch process.

The first etching operation in this embodiment may be performed in an etching environment in which the etch selectivity between the first to third barrier wall layers L1, L2, and L3 is substantially the same. Accordingly, inner surfaces of the first to third barrier wall layers L1, L2, and L3 that define the first preliminary barrier wall opening OP1-P1 may be substantially aligned with one another.

Next, as illustrated in FIG. 8E, the operation of making the first to third barrier wall layers L1, L2, and L3 subject to patterning may include a second etching operation of secondly etching the first to third barrier wall layers L1, L2, and L3. In the second etching operation, the first barrier wall opening OP-P1 may be defined from the first preliminary barrier wall opening OP1-P1 by the first photoresist layer PR1 as a mask. The second etching operation may be performed through a wet etch process.

The second etching operation in this embodiment may be performed in an environment in which the etch selectivity between the first barrier wall layer L1 and the second and third barrier wall layers L2 and L3 is high. Accordingly, the inner surface of the barrier wall PW that defines the first barrier wall opening OP-P1 may have an undercut shape on the section.

Specifically, in the second etching operation, the first barrier wall layer L1 may be mainly etched since the etch rate of the first barrier wall layer L1 by an etching solution is higher than the etch rates of the second and third barrier wall layers L2 and L3 by the etching solution. At this time, depending on conditions of the second etching operation, the second barrier wall layer L2 or the third barrier wall layer L3 may be partially etched together with the first barrier wall layer PL1, and the second barrier wall layer L2 or the third barrier wall layer L3 may not be etched. When the second and third barrier wall layers L2 and L3 are not etched, an operation of firstly etching the first to third barrier wall layers L1, L2, and L3 and thereafter secondly etching only the first barrier wall layer L1 may be performed in an operation of making the preliminary barrier wall IPW subject to patterning.

Through the second etching operation, the first inner surfaces PS1 of the first barrier wall layer L1 may be depressed in a direction away from the center of the 1-1 electrode AE1 when compared to the second inner surfaces PS2 of the second and third barrier wall layers L2 and L3. The second barrier wall layer L2 and the third barrier wall layer L3 may further extend toward the center of the 1-1 electrode AE1 when compared to the first barrier wall layer L1. The tip portions TP may be formed in the barrier wall PW by the portion of the second barrier wall layer L2 that protrudes from the first barrier wall layer L1.

Accordingly, the barrier wall opening OP-P may include the first barrier wall opening OP-P1 and the second barrier wall opening OP-P2. The first barrier wall opening OP-P1 may be defined by the first inner surfaces PS1 of the first barrier wall layer L1. The second barrier wall opening OP-P2 may be defined by the second inner surfaces PS2. On the section, the width W1 of the first barrier wall opening OP-P1 in the one direction may be greater than the width W2 of the second barrier wall opening OP-P2 in the one direction.

An etching method of forming the barrier wall PW from the preliminary barrier wall IPW is not limited to any particular embodiment, and various etching methods may be used depending on the materials of the first to third barrier wall layers L1, L2, and L3.

Figure 8F:
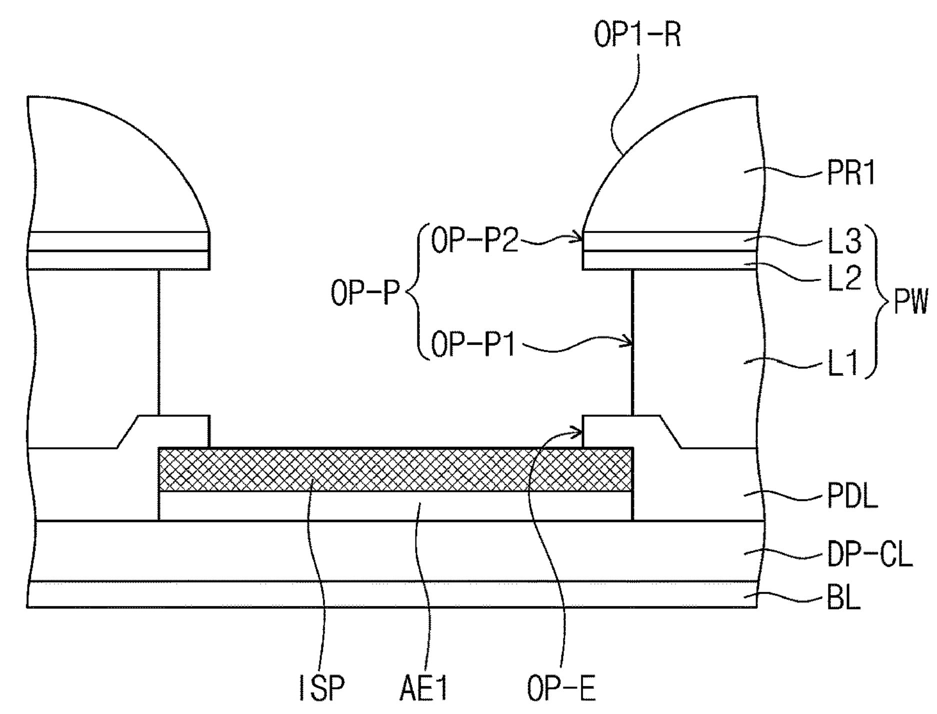

Referring to FIGS. 8E and 8F, the preliminary pixel defining layer IPDL may be etched. As the preliminary pixel defining layer IPDL is etched, the pixel defining layer PDL may be formed. Hereinafter, the etching of the preliminary pixel defining layer IPDL may be defined as a third etching operation.

The third etching operation may be performed through a dry etch process and may be performed by the first photoresist layer PR1 and the second and third barrier wall layers L2 and L3 as a mask. The light-emitting opening OP-E corresponding to the barrier wall opening OP-P may be defined in the pixel defining layer PDL.

Figure 8G:
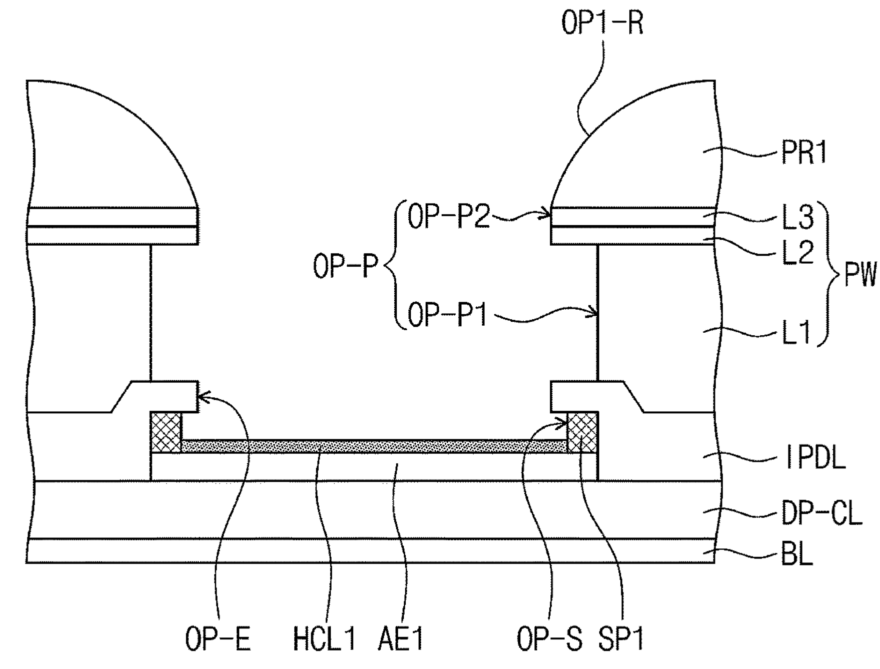

Referring to FIGS. 8F and 8G, the preliminary sacrificial pattern ISP may be etched. Hereinafter, the etching of the preliminary sacrificial pattern ISP may be defined as a fourth etching operation. The fourth etching operation may be performed through a wet etch process. The fourth etching operation may be performed by the first photoresist layer PR1 and the second and third barrier wall layers L2 and L3 as a mask.

As the preliminary sacrificial pattern ISP is etched, the first sacrificial pattern SP1 may be formed. The first sacrificial pattern SP1 may be disposed on the 1-1 electrode AE1. The sacrificial opening OP-S may be defined by the first sacrificial pattern SP1. At least a portion of the 1-1 electrode AE1 may be exposed from the first sacrificial pattern SP1 and the pixel defining layer PDL by the sacrificial opening OP-S and the light-emitting opening OP-E.

The etching of the preliminary sacrificial pattern ISP may be performed in an environment in which the etch selectivity between the preliminary sacrificial pattern ISP and the 1-1 electrode AE1 is high. Accordingly, the 1-1 electrode AE1 may be prevented from being etched together. That is, the preliminary sacrificial pattern ISP having a higher etch rate than that of the 1-1 electrode AE1 may be disposed between the pixel defining layer PDL and the 1-1 electrode AE1, and thus the 1-1 electrode AE1 may be prevented from being etched and damaged together during the etching process.

Although not illustrated, the first photoresist layer PR1 may be removed after the fourth etching operation is completed. In addition, although not illustrated, at least portions of the 1-2 electrode AE2 and the 1-3 electrode AE3 may be exposed from the pixel defining layer PDL and the second and third sacrificial patterns SP2 and SP3 (refer to FIG. 6) through the same operation as that of the 1-1 electrode AE1.

Although not illustrated, the first hole control layer HCL1 may be provided on the 1-1 electrode AE1 after the fourth etching operation is completed. The first hole control layer HCL1 may be disposed in the sacrificial opening OP-S.

Figure 8H:
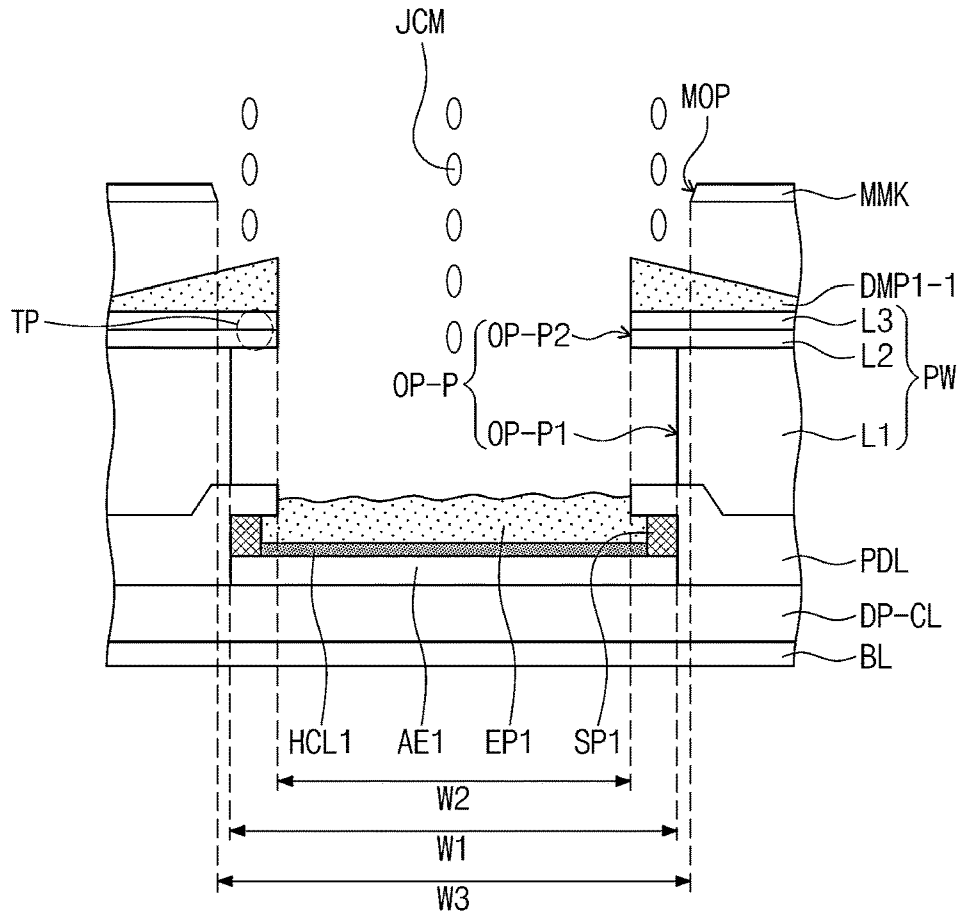
Figure 8I:
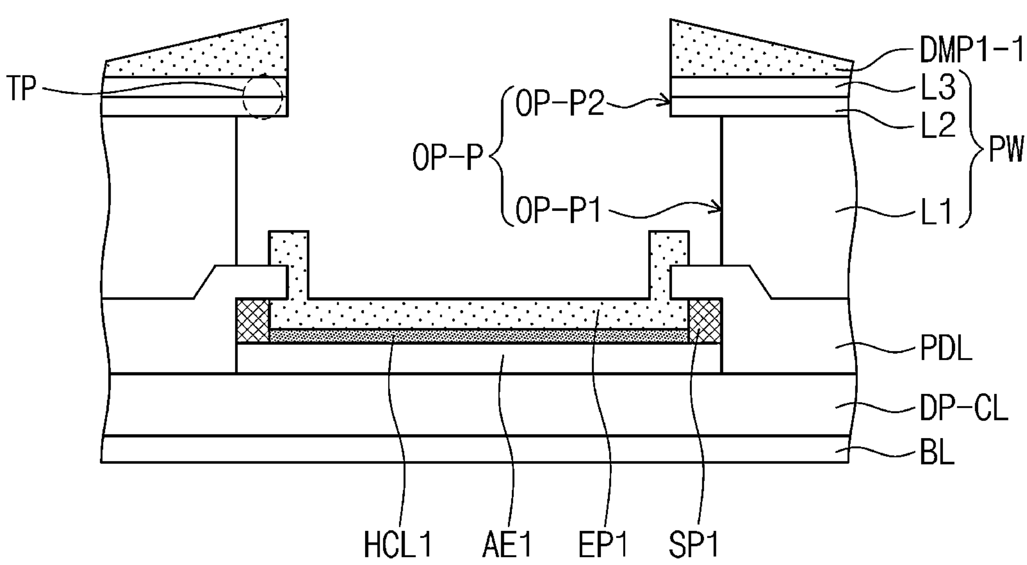

Referring to FIGS. 8H and 81, the first emission pattern EP1 may be formed in the light-emitting opening OP-E and the barrier wall opening OP-P. The 1-1 dummy layers DMP1-1 may be formed on the barrier wall PW.

Specifically, the metal mask MMK may be disposed on the barrier wall PW. The metal mask MMK may be spaced apart from the barrier wall PW by the spacers CS (refer to FIG. 4). The metal mask MMK may have a mask opening MOP defined therein. The mask opening MOP may overlap the 1-1 electrode AE1.

After the metal mask MMK is disposed, a deposition process may be performed to form the first emission pattern EP1 and the 1-1 dummy layers DMP1-1. The deposition process may be performed through a thermal evaporation process. Specifically, deposition materials JCM may be provided on the 1-1 electrode AE1 and the barrier wall PW through the mask opening MOP.

In the operation of forming the first emission pattern EP1, the first emission pattern EP1 may be separated by the tip portion TP formed in the barrier wall PW and may be disposed in the sacrificial opening OP-S, the first light-emitting opening OP-E, and the first barrier wall opening OP-P1.

On the section, the width W3 of the mask opening MOP in the one direction may be greater than the width W1 of the first barrier wall opening OP-P1 and the width W2 of the second barrier wall opening OP-P2 in the one direction. Accordingly, in the operation of forming the first emission pattern EP1, the 1-1 dummy layers DMP1-1 spaced apart from the first emission pattern EP1 may be formed.

The deposition materials JCM may be provided on the upper surface of the barrier wall PW that overlaps the mask opening MOP and may flow toward the center of the barrier wall PW. Accordingly, the 1-1 dummy layers DMP1-1 may have an inclined surface. The heights of the upper surfaces of the 1-1 dummy layers DMP1-1 may be lowered toward the center of the barrier wall PW.

When the emission patterns EP (refer to FIG. 6) are formed without using the metal mask MMK, the deposition materials JCM may be provided to the entirety of the region of the circuit element layer DP-CL. In this case, when a material for forming one of the first to third emission patterns EP1 to EP3 is provided, the light-emitting openings OP-E in which the other emission patterns are disposed may be covered by a photoresist layer. Accordingly, the first light-emitting element ED1, the second light-emitting element ED2, and the third light-emitting element ED3 illustrated in FIG. 5 may be formed through different processes.

Specifically, when the display panel DP (refer to FIG. 4) is manufactured without using the metal mask MMK, the first electron control layer ECL1 (refer to FIG. 6), the 2-1 electrode CE1 (refer to FIG. 6), the first capping pattern CPP1 (refer to FIG. 6), and the thin film encapsulation layer TFE may be formed on the first emission pattern EP1 after the first emission pattern EP1 is formed.

Next, when the second emission pattern EP2 is formed, a photoresist layer may be formed on the first emission pattern EP1. A material for forming the second emission pattern EP2 and materials for forming the second electron control layer ECL2 (refer to FIG. 6), the 2-2 electrode CE2 (refer to FIG. 6), the second capping pattern CPP2 (refer to FIG. 6), and the thin film encapsulation layer TFE that are provided on the second emission pattern EP2 may be provided. At this time, the materials for forming the second emission pattern EP2, the second electron control layer ECL2 (refer to FIG. 6), the 2-2 electrode CE2 (refer to FIG. 6), the second capping pattern CPP2 (refer to FIG. 6), and the thin film encapsulation layer TFE may also be provided on the photoresist layer disposed on the first emission pattern EP1. In this case, the materials provided on the photoresist layer may be removed through an etching process.

Thereafter, a material for forming the third emission pattern EP3 and materials for forming the third electron control layer ECL3 (refer to FIG. 6), the 2-3 electrode CE3 (refer to FIG. 6), the third capping pattern CPP3 (refer to FIG. 6), and the thin film encapsulation layer TFE that are provided on the third emission pattern EP3 may be provided. At this time, photoresist layers may be formed on the first and second emission patterns EP1 and EP2. The materials for forming the third emission pattern EP3, the third electron control layer ECL3 (refer to FIG. 6), the 2-3 electrode CE3 (refer to FIG. 6), the third capping pattern CPP3 (refer to FIG. 6), and the thin film encapsulation layer TFE may also be provided on the photoresist layers formed on the first and second emission patterns EP1 and EP2. In this case, the materials provided on the photoresist layers may be removed through an etching process.

That is, every time one light-emitting element ED among the light-emitting elements ED (refer to FIG. 6) is formed, a process of removing a material provided on a photoresist layer may be repeated. Due to this, a process operation may be increased. In addition, when the material remains without being completely removed, a defect rate of the display panel DP (refer to FIG. 6) may be increased.

However, in an embodiment according to the disclosure, the first emission pattern EP1, the second emission pattern EP2, and the third emission pattern EP3 may be formed through the metal mask MMK, and thereafter the electron control layers ECL, the second electrodes CE2, the capping patterns CPP, the dummy part DMP, and the thin film encapsulation layer TFE may be simultaneously provided on the entirety of the circuit element layer DP-CL. Accordingly, the process of disposing the photoresist layer on the emission pattern EP and the process of providing the material on the photoresist layer may be omitted, and thus the overall process may be simplified. In addition, the defect rate of the display panel DP (refer to FIG. 6) caused by the remaining material on the photoresist layer may be improved.

Figure 8J:
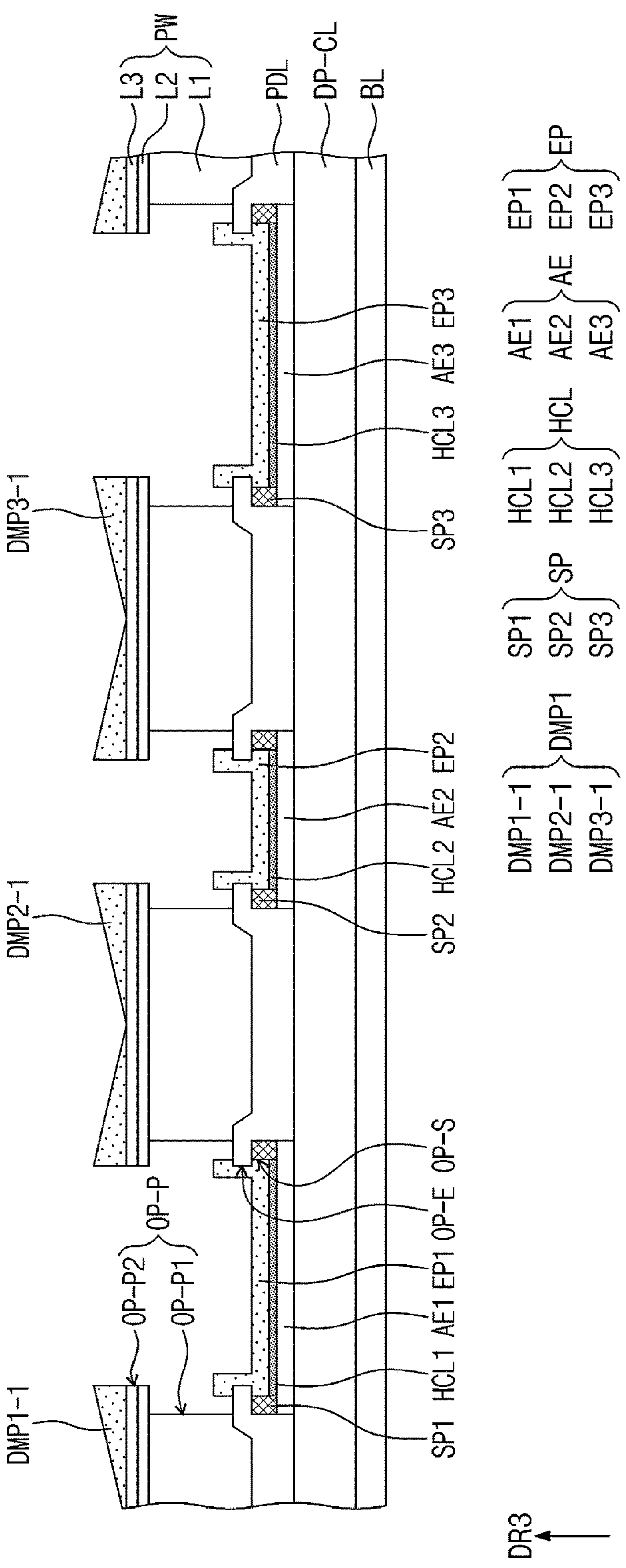

Referring to FIG. 8J, the processes described with reference to FIGS. 8A to 81 may be identically applied to the second emission pattern EP2 and the third emission pattern EP3.

Specifically, the second emission pattern EP2 may be disposed over the 1-2 electrode AE2. The second emission pattern EP2 may be disposed in a corresponding light-emitting opening OP-E among the light-emitting openings OP-E. The second emission pattern EP2 may be disposed in a corresponding barrier wall opening OP-P among the barrier wall openings OP-P. The 2-1 dummy layer DMP2-1 may be disposed on the barrier wall PW adjacent to the 1-2 electrode AE2. The 2-1 dummy layer DMP2-1 may have an inclined surface. The height of the upper surface of the 2-1 dummy layer DMP2-1 may be lowered toward the center of the barrier wall PW.

The third emission pattern EP3 may be disposed over the 1-3 electrode AE3. The third emission pattern EP3 may be disposed in a corresponding light-emitting opening OP-E among the light-emitting openings OP-E. The third emission pattern EP3 may be disposed in a corresponding barrier wall opening OP-P among the barrier wall openings OP-P. The 3-1 dummy layer DMP3-1 may be disposed on the barrier wall PW adjacent to the 1-3 electrode AE3. The 3-1 dummy layer DMP3-1 may have an inclined surface. The height of the upper surface of the 3-1 dummy layer DMP3-1 may be lowered toward the center of the barrier wall PW.

Figure 8K:
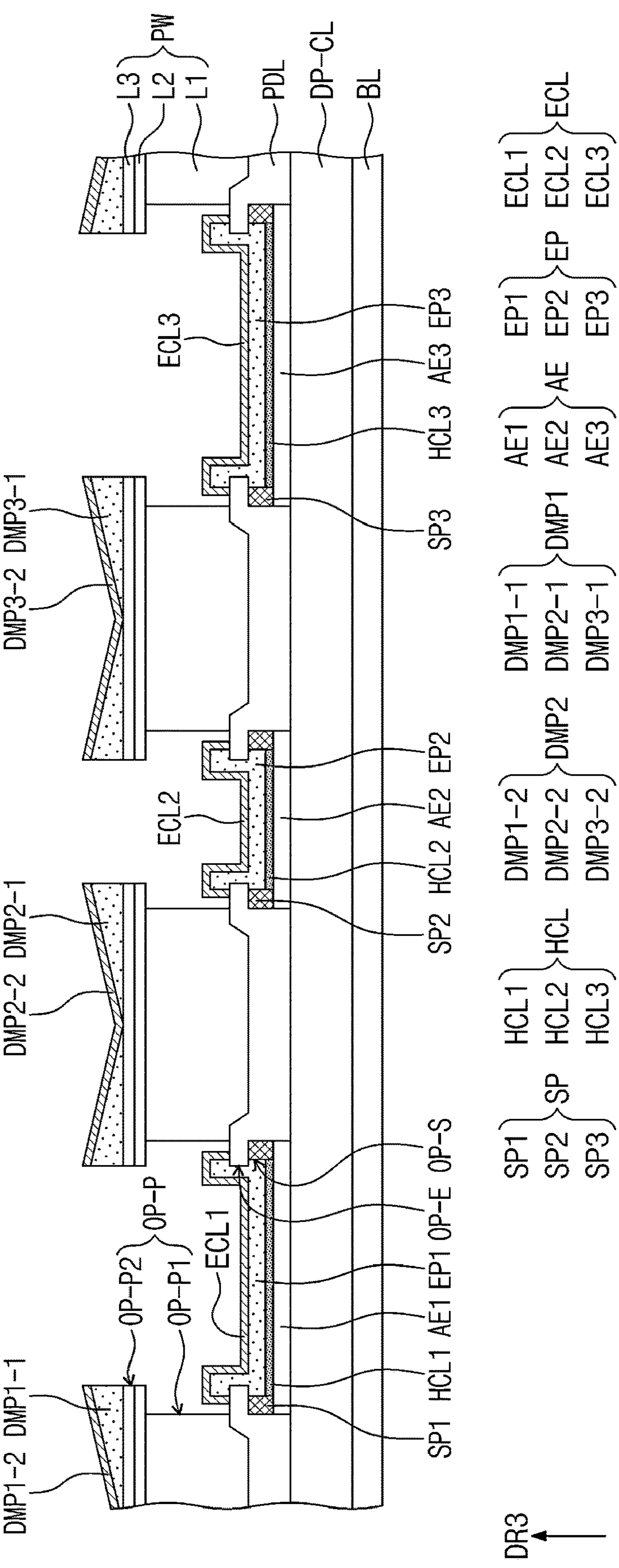

Referring to FIG. 8K, the electron control layers ECL may be formed on the emission patterns EP. The electron control layers ECL may be separated by the tip portions TP defined in the barrier wall PW. Accordingly, the electron control layers ECL may be disposed in the sacrificial openings OP-S, the light-emitting openings OP-E, and the barrier wall openings OP-P. Each of the electron control layers ECL may cover a corresponding emission pattern EP among the emission patterns EP.

The electron control layers ECL may include the first electron control layer ECL1, the second electron control layer ECL2, and the third electron control layer ECL3. The first electron control layer ECL1 may be disposed on the first emission pattern EP1. The second electron control layer ECL2 may be disposed on the second emission pattern EP2. The third electron control layer ECL3 may be disposed on the third emission pattern EP3.

When the electron control layers ECL are formed, the second dummy layer DMP2 spaced apart from the electron control layers ECL may be formed. The second dummy layer DMP2 may be disposed on the barrier wall PW. The second dummy layer DMP2 may be disposed on the first dummy layers DMP1. The second dummy layer DMP2 may be disposed along the upper surfaces of the first dummy layers DMP1. Accordingly, the second dummy layer DMP2 may have inclined surfaces corresponding to the inclined surfaces of the first dummy layers DMP1. The height of the upper surface of the second dummy layer DMP2 may be lowered toward the center of the barrier wall PW.

The second dummy layer DMP2 may not be separated on the barrier wall PW. When viewed on the section, the second dummy layer DMP2 may have a V-shape on the barrier wall PW. In an embodiment, the 1-2 dummy layer DMP1-2 may be connected with the 2-2 dummy layer DMP2-2 adjacent thereto, for example. The 2-2 dummy layer DMP2-2 may be connected with the 3-2 dummy layer DMP3-2 adjacent thereto.

Figure 8L:
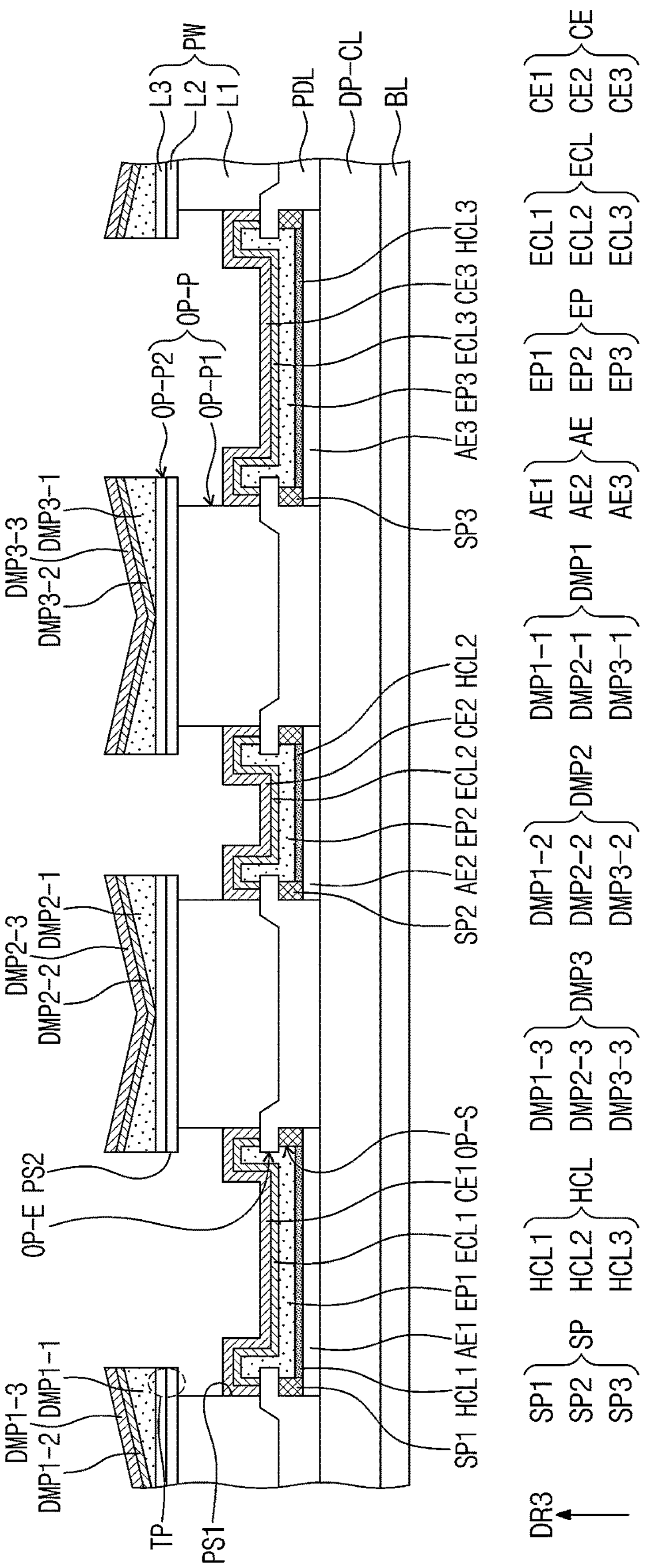

Referring to FIG. 8L, the second electrodes CE may be disposed on the electron control layers ECL. The third dummy layer DMP3 may be disposed on the second dummy layer DMP2. The second electrodes CE and the third dummy layer DMP3 may be simultaneously formed.

Specifically, in an operation of forming the second electrodes CE, the second electrodes CE may be separated by the tip portions TP of the barrier wall PW, and each of the second electrodes CE may be disposed in a corresponding light-emitting opening OP-E among the light-emitting openings OP-E and a corresponding barrier wall opening OP-P among the barrier wall openings OP-P. The second electrodes CE may be brought into contact with the first inner surfaces PS1 of the first barrier wall layer L1. The second electrodes CE may be electrically connected with the barrier wall PW.

The second electrodes CE may include the 2-1 electrode CE1, the 2-2 electrode CE2, and the 2-3 electrode CE3. The 2-1 electrode CE1 may be disposed on the first electron control layer ECL1. The 2-2 electrode CE2 may be disposed on the second electron control layer ECL2. The 2-3 electrode CE3 may be disposed on the third electron control layer ECL3.

The third dummy layer DMP3 may be disposed on the second dummy layer DMP2. The third dummy layer DMP3 may be disposed along the upper surface of the second dummy layer DMP2. Accordingly, the third dummy layer DMP3 may have inclined surfaces corresponding to the inclined surfaces of the second dummy layer DMP2. The height of the upper surface of the third dummy layer DMP3 may be lowered toward the center of the barrier wall PW.

The third dummy layer DMP3 may not be separated on the barrier wall PW. When viewed on the section, the third dummy layer DMP3 may have a V-shape on the barrier wall PW. In an embodiment, the 1-3 dummy layer DMP1-3 may be connected with the 2-3 dummy layer DMP2-3 adjacent thereto, for example. The 2-3 dummy layer DMP2-3 may be connected with the 3-3 dummy layer DMP3-3 adjacent thereto.

Figure 8M:
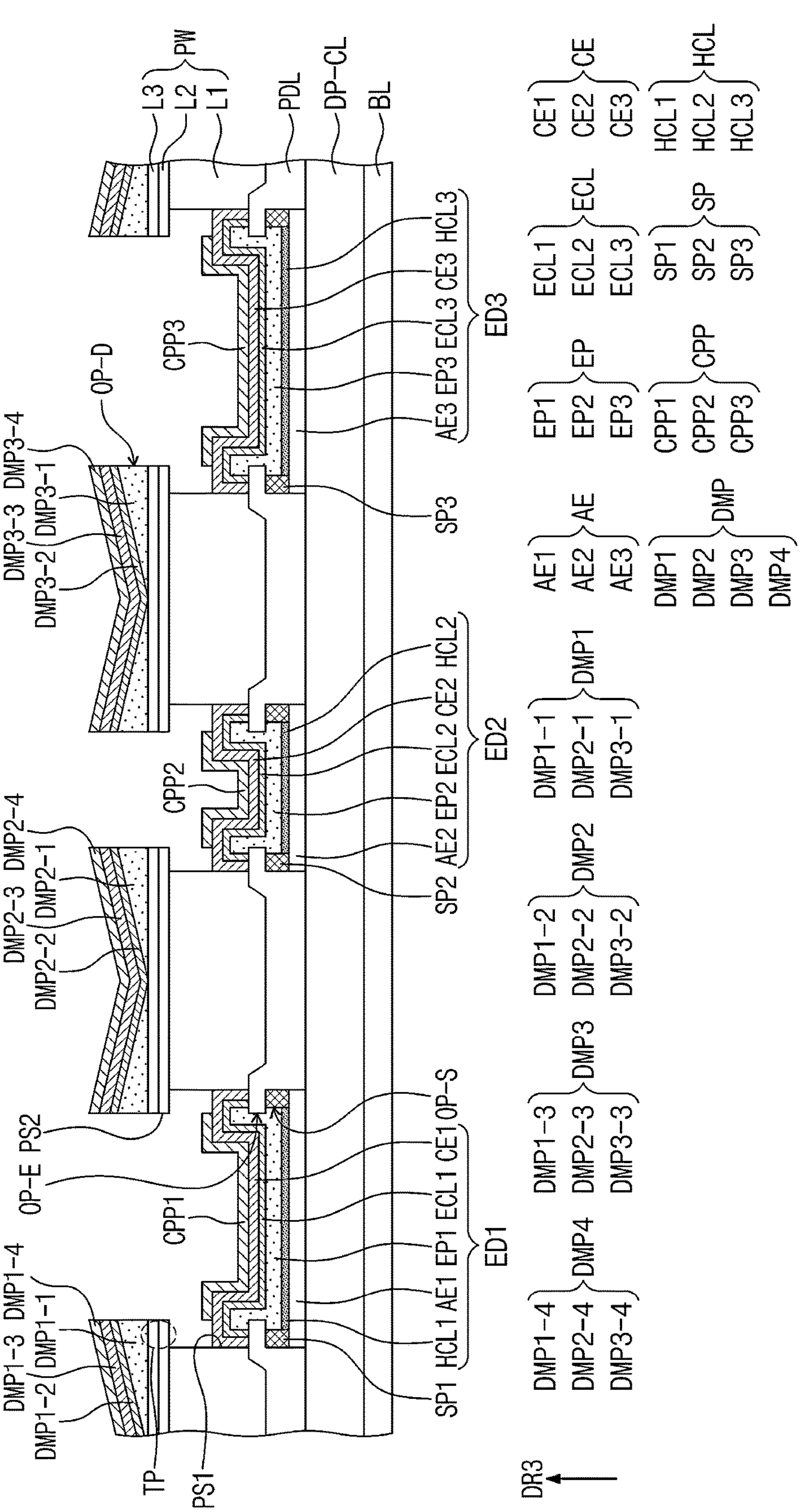

Referring to FIG. 8M, the capping patterns CPP may be disposed on the second electrodes CE. The capping patterns CPP and the fourth dummy layer DMP4 may be simultaneously formed.

Specifically, in an operation of forming the capping patterns CPP, the capping patterns CPP may be separated by the tip portions TP of the barrier wall PW, and each of the capping patterns CPP may be disposed in a corresponding barrier wall opening OP-P among the barrier wall openings OP-P.

The capping patterns CPP may include the first capping pattern CPP1, the second capping pattern CPP2, and the third capping pattern CPP3. The first capping pattern CPP1 may be disposed on the 2-1 electrode CE1. The second capping pattern CPP2 may be disposed on the 2-2 electrode CE2. The third capping pattern CPP3 may be disposed on the 2-3 electrode CE3.

The fourth dummy layer DMP4 may be disposed on the third dummy layer DMP3. The fourth dummy layer DMP4 may be disposed along the upper surface of the third dummy layer DMP3. Accordingly, the fourth dummy layer DMP4 may have inclined surfaces corresponding to the inclined surfaces of the third dummy layer DMP3. The height of the upper surface of the fourth dummy layer DMP4 may be lowered toward the center of the barrier wall PW.

The fourth dummy layer DMP4 may not be separated on the barrier wall PW. When viewed on the section, the fourth dummy layer DMP4 may have a V-shape on the barrier wall PW. In an embodiment, the 1-4 dummy layer DMP1-4 may be connected with the 2-4 dummy layer DMP2-4 adjacent thereto, for example. The 2-3 dummy layer DMP2-3 may be connected with the 3-4 dummy layer DMP3-4 adjacent thereto.

The first to fourth dummy layers DMP1 to DMP4 may be stacked in the third direction DR3. The dummy openings OP-D may be defined by the inner surfaces of the dummy part DMP.

The electron control layers ECL, the second electrodes CE, and the capping patterns CPP may be simultaneously formed on the first to third emission patterns EP1 to EP3.

Figure 8N:
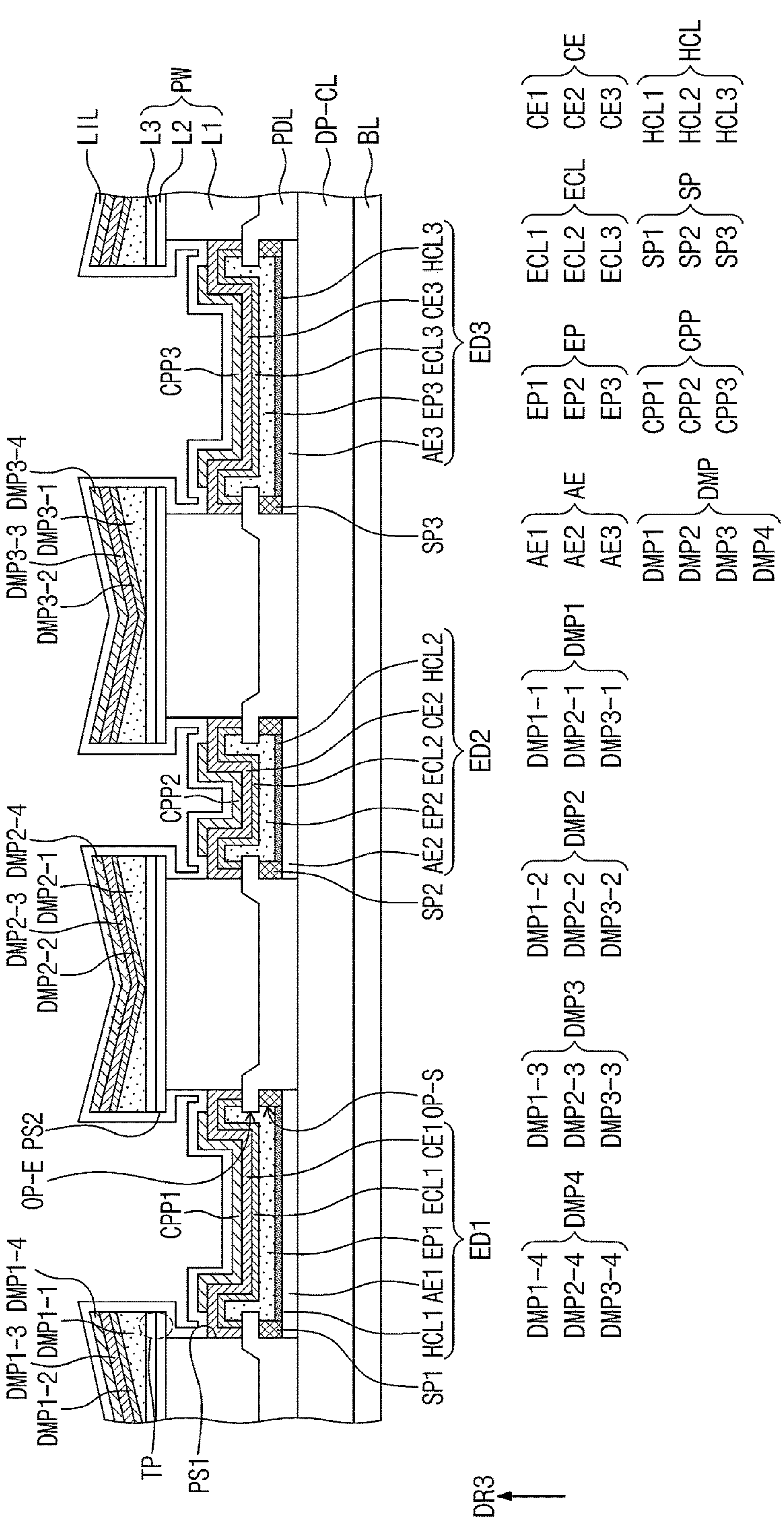
Figure 80:
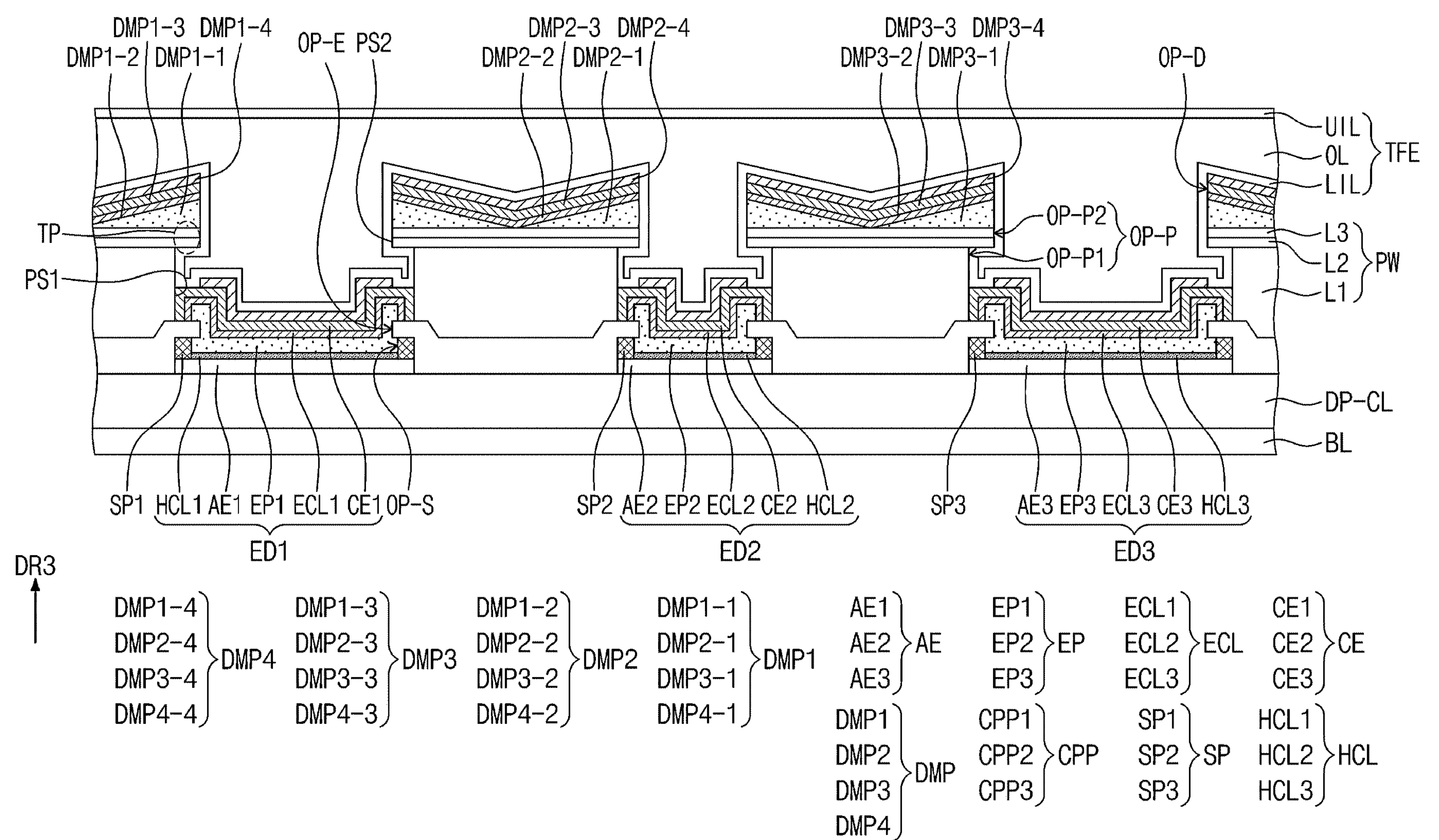

Referring to FIG. 8N, the first inorganic layer LIL may be disposed on the capping patterns CPP. The first inorganic layer LIL may be simultaneously provided on the second electrodes CE, the capping patterns CPP, and the dummy part DMP. In an embodiment, the first inorganic layer LIL may be formed through a CVD process, for example.

The first inorganic layer LIL may cover the second electrodes CE, the capping patterns CPP, and the dummy part DMP. The first inorganic layer LIL may be disposed in the barrier wall openings OP-P and the dummy openings OP-D.

The first inorganic layer LIL may not be separated on the barrier wall PW. As illustrated in FIG. 8N, on the dummy part DMP and the capping patterns CPP, the first inorganic layer LIL may be unitary without being separated.

The first inorganic layer LIL may include an inorganic material, e.g., silicon nitride (SiNx).

Referring to FIGS. 8K to 8N, the electron control layers ECL, the second electrodes CE, the capping patterns CPP, the dummy part DMP, and the first inorganic layer LIL may be formed without using the metal mask MMK (refer to FIG. 8H). In this case, since the emission patterns EP are formed by the metal mask MMK (refer to FIG. 8H), the electron control layers ECL, the second electrodes CE, the capping patterns CPP, the dummy part DMP, and the first inorganic layer LIL may be simultaneously provided on the emission patterns EP and the barrier wall PW without a photoresist layer (not illustrated).

In an embodiment, when the emission patterns EP are not formed by the metal mask MMK, a deposition process for forming one light-emitting element ED among the light-emitting elements ED (refer to FIG. 6) may be performed, for example. Thereafter, before the other light-emitting elements ED are formed, a photoresist layer (not illustrated) may be formed to prevent materials for forming the other light-emitting elements ED from infiltrating into the already-formed light-emitting element ED. In a process of forming the other light-emitting elements ED, the materials provided on the photoresist layer (not illustrated) may be removed through an etching process. Therefore, the process of removing the materials provided on the photoresist layer may be performed a plurality of times.

However, in the case of the display panel DP (refer to FIG. 4) in the embodiment of the disclosure, the emission patterns EP may be formed through the metal mask MMK, and the electron control layers ECL, the second electrodes CE, and the capping patterns CPP may be simultaneously formed on the first to third emission patterns EP1, EP2, and EP3. Accordingly, an etching process may be omitted, and the overall process may be simplified. In addition, as the etching process is omitted, a defect in the display panel DP (refer to FIG. 4) caused by a material remaining after the etching process may be improved.

Referring to FIG. 8O, the organic layer OL and the second inorganic layer UIL may be formed on the first inorganic layer LIL. The organic layer OL may be disposed in the barrier wall openings OP-P and the dummy openings OP-D.

The organic layer OL may be formed by applying an organic material using an inkjet method, but is not limited thereto. The organic layer OL may provide a flat upper surface.

The second inorganic layer UIL may be formed on the organic layer OL. The second inorganic layer UIL may be formed by depositing an inorganic material. Accordingly, the thin film encapsulation layer TFE may be formed.

By the embodiments of the disclosure, the first to third emission patterns may be formed by the metal mask, and the common layer and the thin film encapsulation layer disposed on the emission patterns may be simultaneously formed on the first to third emission patterns without using the metal mask. Accordingly, an etching process for the common layer and the thin film encapsulation layer may be omitted. As a result, the overall process may be simplified, the process reliability may be improved, and a defect rate of the display panel may be reduced.

While the disclosure has been described with reference to embodiments thereof, it will be apparent to those of ordinary skill in the art that various changes and modifications may be made thereto without departing from the spirit and scope of the disclosure as set forth in the following claims.

What is claimed is:

1. A display device comprising:

a base layer;

a first electrode disposed on the base layer;

a pixel defining layer which defines a light-emitting opening exposing at least a portion of the first electrode, the pixel defining layer being disposed on the base layer;

a barrier wall disposed on the pixel defining layer and defining a barrier wall opening corresponding to the light-emitting opening;

an emission pattern disposed on the first electrode in the barrier wall opening;

a second electrode disposed on the emission pattern in the barrier wall opening; and a dummy part disposed on the barrier wall, the dummy part including a same material as a material of the emission pattern and the second electrode, wherein an upper surface of the dummy part has an inclined surface.

2. The display device of claim 1, wherein a height of the upper surface of the dummy part is lowered toward a center of the barrier wall.

3. The display device of claim 1, further comprising:

a hole control layer disposed between the first electrode and the emission pattern;

an electron control layer disposed between the second electrode and the emission pattern; and a capping pattern disposed on the second electrode.

4. The display device of claim 3, wherein the dummy part includes:

a first dummy layer including a same material as the material of the emission pattern;

a second dummy layer disposed on the first dummy layer, the second dummy layer including a same material as a material of the electron control layer;

a third dummy layer disposed on the second dummy layer, the third dummy layer including a same material as the material of the second electrode; and a fourth dummy layer disposed on the third dummy layer, the fourth dummy layer including a same material as a material of the capping pattern, and wherein upper surfaces of the second dummy layer, the third dummy layer, and the fourth dummy layer have inclined surfaces, respectively, on the barrier wall.

5. The display device of claim 3, further comprising:

a thin film encapsulation layer covering the capping pattern and the dummy part.

6. The display device of claim 5, wherein the thin film encapsulation layer includes:

a first inorganic layer disposed on the capping pattern and the dummy part;

an organic layer disposed on the first inorganic layer; and a second inorganic layer disposed on the organic layer, and wherein the first inorganic layer has an inclined surface corresponding to the upper surface of the dummy part.

7. The display device of claim 1, wherein the second electrode disposed on the emission pattern contacts an inner surface of the barrier wall defining the barrier wall opening.

8. The display device of claim 7, wherein the barrier wall includes a conductive material, and the second electrode is electrically connected to the barrier wall.

9. The display device of claim 1, further comprising:

a sacrificial pattern disposed on the first electrode and defining a sacrificial opening exposing at least a portion of the first electrode, wherein the emission pattern is disposed in the sacrificial opening.

10. The display device of claim 1, wherein the barrier wall includes:

a first barrier wall layer disposed on the pixel defining layer;

a second barrier wall layer disposed on the first barrier wall layer and extending closer to the center of the first electrode than the first barrier wall layer is to the center of the first electrode; and a third barrier wall layer disposed on the second barrier wall layer, the third barrier wall layer having a same length as a length of the second barrier wall layer, and wherein the first barrier wall layer is depressed when compared to the second barrier wall layer and the third barrier wall layer.

11. A method for manufacturing a display device, the method comprising:

providing a first electrode on a base layer;

providing a pixel defining layer on the base layer to cover the first electrode;

providing a barrier wall on the pixel defining layer;

defining a light-emitting opening and a barrier wall opening to expose at least a portion of the first electrode;

providing, on the barrier wall, a metal mask in which a mask opening overlapping the light-emitting opening and the barrier wall opening is defined;

providing an emission pattern and a second electrode on the first electrode in the light-emitting opening and the barrier wall opening; and providing, on the barrier wall, a dummy part including a same material as a material of the emission pattern and the second electrode, wherein the dummy part is simultaneously formed together with the emission pattern and the second electrode.

12. The method of claim 11, wherein an upper surface of the dummy part has an inclined surface.

13. The method of claim 12, wherein a height of the upper surface of the dummy part is lowered toward the center of the barrier wall.

14. The method of claim 13, wherein the providing the first electrode includes providing a hole control layer on the first electrode, and wherein the providing the emission pattern and the second electrode includes:

providing an electron control layer between the second electrode and the emission pattern; and providing a capping pattern on the second electrode.

15. The method of claim 14, wherein the dummy part includes:

a first dummy layer including a same material as the material of the emission pattern;

a second dummy layer disposed on the first dummy layer, the second dummy layer including a same material as a material of the electron control layer;

a third dummy layer disposed on the second dummy layer, the third dummy layer including a same material as the material of the second electrode; and a fourth dummy layer disposed on the third dummy layer, the fourth dummy layer including a same material as a material of the capping pattern.

16. The method of claim 15, further comprising:

providing a thin film encapsulation layer covering the capping pattern and the dummy part.

17. The method of claim 16, wherein the thin film encapsulation layer includes:

a first inorganic layer disposed on the capping pattern and the dummy part;

an organic layer disposed on the first inorganic layer; and a second inorganic layer disposed on the organic layer, and wherein the first inorganic layer has an inclined surface corresponding to the upper surface of the dummy part.

18. The method of claim 11, wherein the barrier wall includes a conductive material, and the second electrode disposed on the emission pattern is electrically connected with the barrier wall by contacting an inner surface of the barrier wall defining the barrier wall opening.

19. The method of claim 11, wherein the mask opening has a larger width than the barrier wall opening.

20. The method of claim 11, wherein the barrier wall includes:

a first barrier wall layer disposed on the pixel defining layer;

a second barrier wall layer disposed on the first barrier wall layer and extending closer to the center of the first electrode than the first barrier wall layer is to the center of the first electrode; and a third barrier wall layer disposed on the second barrier wall layer, the third barrier wall layer having a same length as a length of the second barrier wall layer, and wherein the first barrier wall layer is depressed when compared to the second barrier wall layer and the third barrier wall layer.

* * * * *